United States Patent
Ooishi et al.

(10) Patent No.: US 6,807,101 B2
(45) Date of Patent: Oct. 19, 2004

(54) SEMICONDUCTOR MEMORY DEVICE

(75) Inventors: Tsukasa Ooishi, Hyogo (JP); Jun Ohtani, Hyogo (JP); Hiroshi Kato, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/326,141

(22) Filed: Dec. 23, 2002

(65) Prior Publication Data

US 2003/0169622 A1 Sep. 11, 2003

(30) Foreign Application Priority Data

Mar. 6, 2002 (JP) ........................................ 2002-060157

(51) Int. Cl.$^7$ .............................................. G11C 16/00
(52) U.S. Cl. .............................. 365/185.21; 365/189.01
(58) Field of Search ....................... 365/185.21, 189.01, 365/189.22, 185.24, 244, 189.07

(56) References Cited

U.S. PATENT DOCUMENTS 6,049,899 A * 4/2000 Auclair et al. ......... 365/185.03
6,222,768 B1   4/2001 Hollmer et al.

FOREIGN PATENT DOCUMENTS

JP          04-321997          11/1992

OTHER PUBLICATIONS

U.S. patent application Ser. No. 10/302,963—your Reference: 902111–01, our Reference: 57454–800, filed Nov. 25, 2002.

* cited by examiner

Primary Examiner—Thong Q. Le
(74) Attorney, Agent, or Firm—McDermott Will & Emery LLP

(57) ABSTRACT

A plurality of sense amplifiers are connected to a selected bit line. Each sense amplifier is supplied with a residual current corresponding to a current flowing in a memory cell and a reference current serving as a reference for a threshold voltage of the memory cell to sense the currents. Operations of the sense amplifiers are controlled such that different sense margins are provided to different sense amplifiers and a margin failure is detected according to coincidence/non-coincidence in logical level between output signals of the sense amplifiers. The address of a memory cell with the margin failure is registered. With such a construction, a threshold voltage defect of a non-volatile memory cell is compensated for to enable internal reading of memory cell data with correctness.

20 Claims, 20 Drawing Sheets

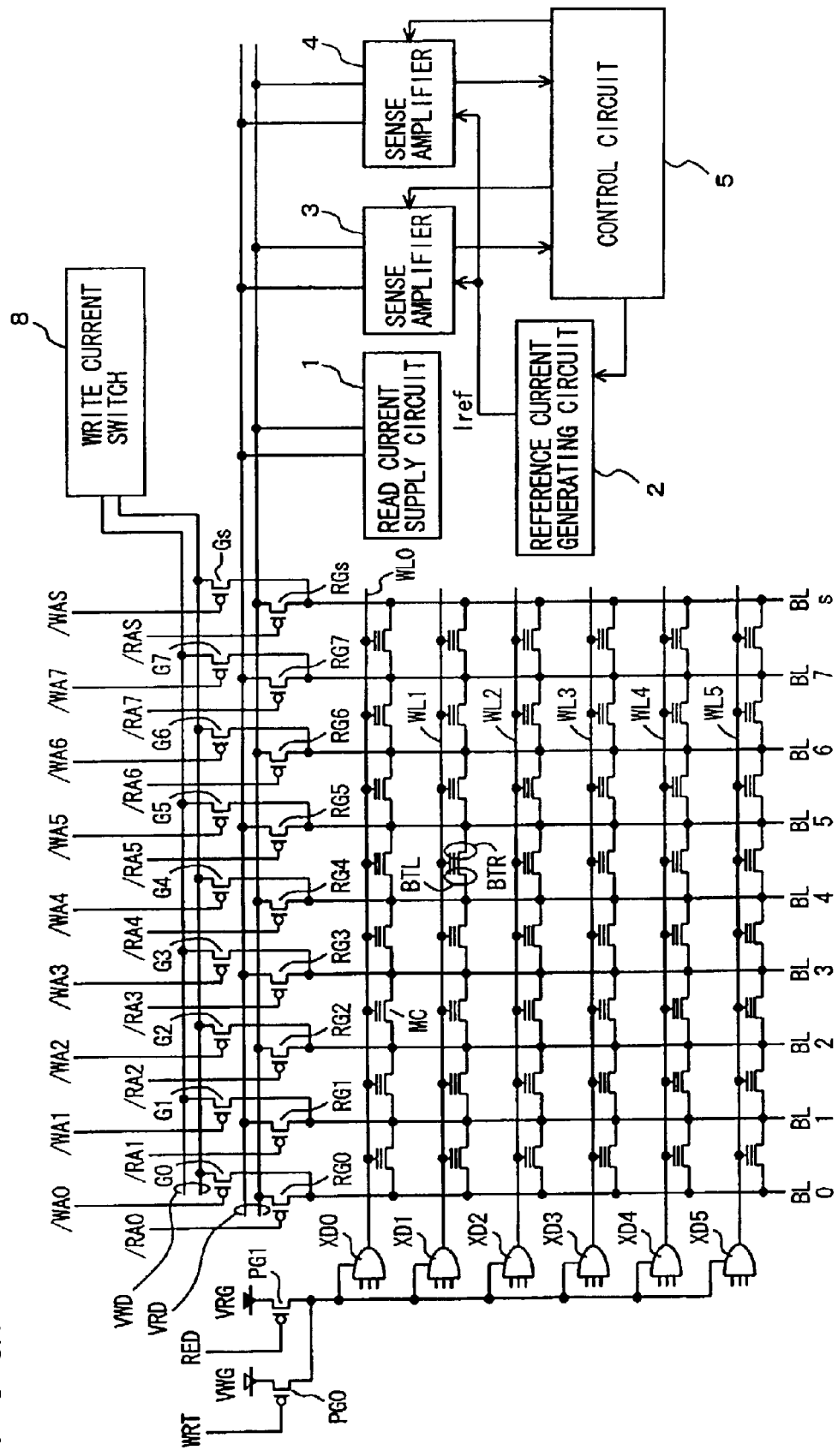
F I G. 1

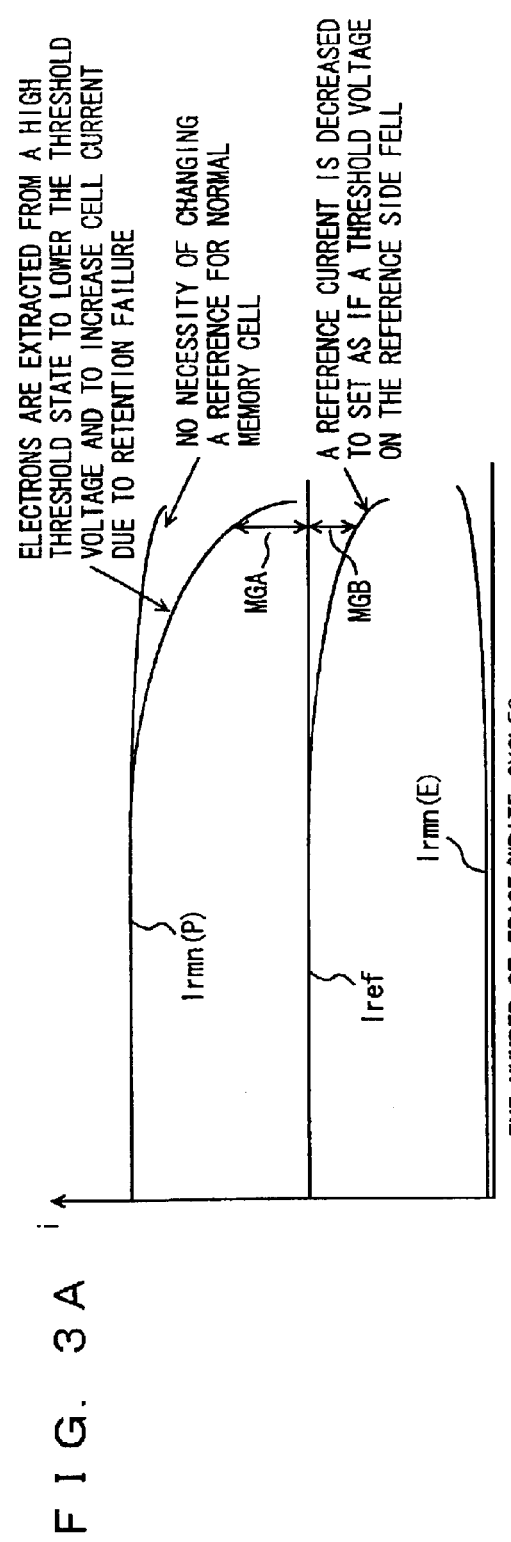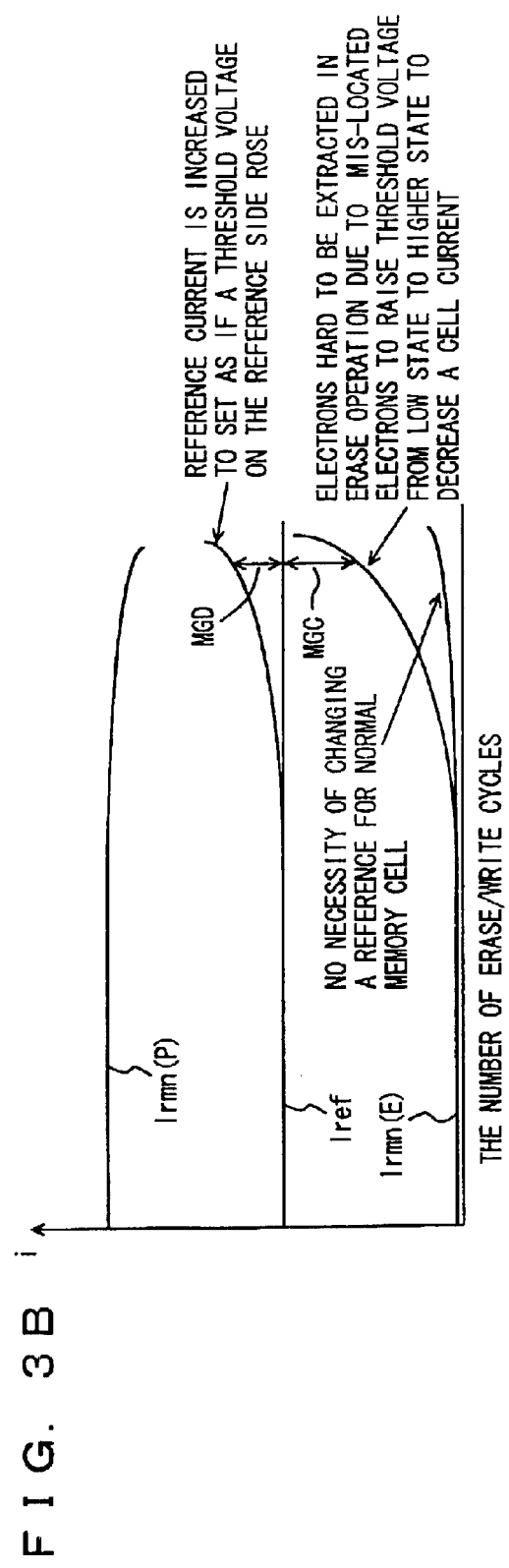
FIG. 3A
FIG. 3B

F I G. 5
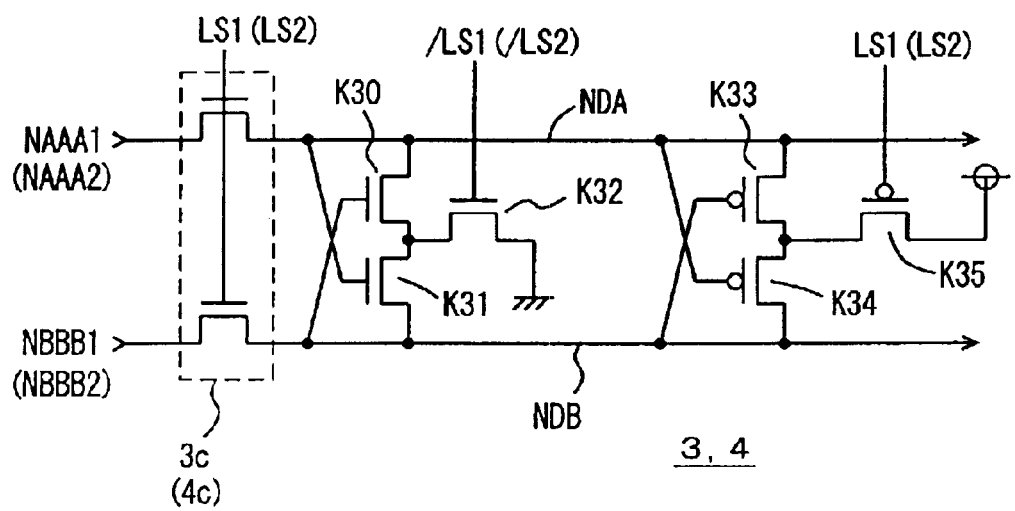

F I G. 9

| SUB SENSE RESULT (SENSE AMP 3) | MAIN SENSE RESULT (SENSE AMP 4) | COINCIDENCE/ NON-COINCIDENCE | MARGIN OK/NG | RECOGNITION | SITUATIONS | MEASURES |
|---|---|---|---|---|---|---|
| HIGH THRESHOLD VOLTAGE | HIGH THRESHOLD VOLTAGE | COINCIDENCE | OK | | | |
| LOW THRESHOLD VOLTAGE | HIGH THRESHOLD VOLTAGE | NON-COINCIDENCE | NG | SET HIGH THRESHOLD VOLTAGE DROPS | CURRENT FLOWS THOUGH MEMORY CELL SHOULD BE IN OFF STATE, TO DECREASE CURRENT FLOWING INTO SENSE AMPLIFIER | CURRENT Iref ON THE REFERENCE SIDE IS DECREASED |
| LOW THRESHOLD VOLTAGE | LOW THRESHOLD VOLTAGE | COINCIDENCE | OK | | | |
| HIGH THRESHOLD VOLTAGE | LOW THRESHOLD VOLTAGE | NON-COINCIDENCE | NG | SET LOW THRESHOLD VOLTAGE RISES | CURRENT FLOWING INTO SENSE AMPLIFIER INCREASES THOUGH A MEMORY CELL SHOULD DISCHARGE A CURRENT | CURRENT Iref ON THE REFERENCE SIDE IS INCREASED |

F I G. 1 4
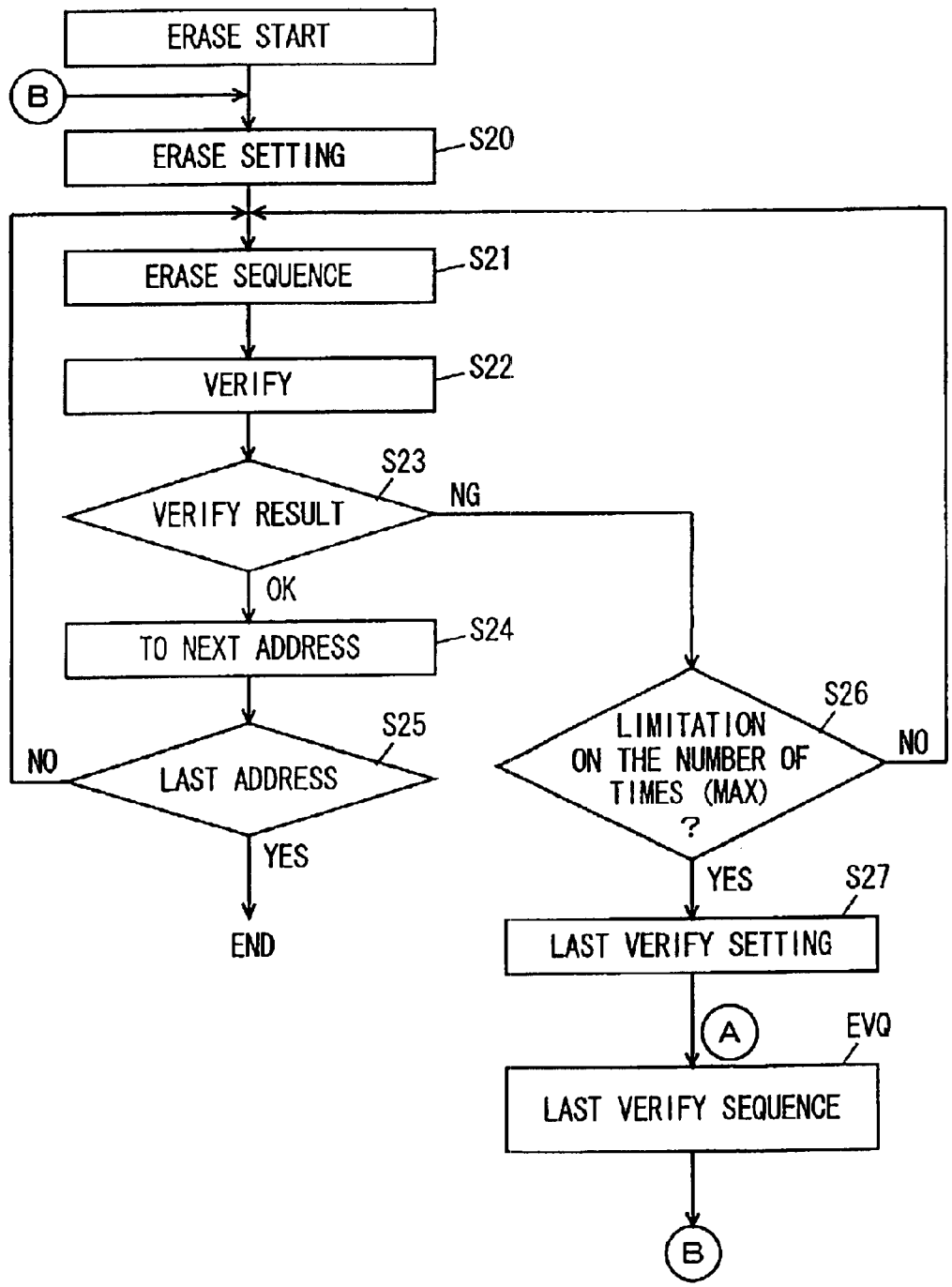

SEMICONDUCTOR MEMORY DEVICE

BACKGROUND OF THE INVENTION

1. Field of the Invention

The present invention relates to a semiconductor memory device, and particularly, to a configuration of a data reading section in a non-volatile semiconductor memory device storing information in a non-volatile manner. More particularly, the present invention relates to a semiconductor memory device capable of correctly reading data even when a characteristic of a memory cell is deteriorated.

2. Description of the Background Art

A non-volatile semiconductor memory device storing data in a non-volatile manner has been known as one of semiconductor memory devices. A memory cell of the non-volatile semiconductor memory device is constituted of one transistor. Data is stored by accumulating electric charges in a charge accumulating region electrically isolated from the surroundings of the memory cell transistor to change a threshold voltage of the memory cell transistor. Since electric charges (referred to as charges simply hereinafter) are stored in a charge accumulating region isolated electrically from the surroundings, even if a power supply is cut off, the charges continue being accumulated in the charge accumulating region and data can be stored in a non-volatile manner.

FIG. 20 is a diagram schematically showing a sectional structure of a conventional non-volatile memory cell. In FIG. 20, the non-volatile memory cell includes: impurity regions 901 and 902 formed spaced apart from each other on a surface of a semiconductor substrate region 900; a charge accumulating region 903 formed above a channel forming region between impurity regions 901 and 902; and a control gate electrode 904 formed above charge accumulating region 903. Charge accumulating region 903 is constituted of a floating gate made of polysilicon or the like, or of a nitride film. In a case where charge accumulating region 903 is constituted of a nitride film, oxide films are formed between charge accumulating region 903 and control gate electrode 904, and between charge accumulating region 903 and substrate region 900.

In a construction of a non-volatile memory cell shown in FIG. 20, accumulation of charges (an electron is indicated by e–) into charge accumulating region 903 is performed in the following way. That is, impurity region 901 is supplied with a high voltage in the range from 4 V to 5 V, for example, while impurity region 902 is maintained at ground voltage level. Control gate electrode 904 is applied with a voltage in the range from 5 V to 6 V.

In this state, a channel region 905 is formed at the surface of the substrate between impurity regions 901 and 902 and a current I flows from impurity region 901 to impurity region 902. Current I flowing in channel region 905 is accelerated by a high electric field formed in the vicinity of impurity region 901 (drain region) to form hot electrons. The hot electrons are accelerated in a direction toward charge accumulating region 903 by a high voltage applied to control gate electrode 904 and injected into charge accumulating region 903. In a case where charge accumulating region 903 is formed of polysilicon or the like, injected electrons move over an entire of charge accumulating region 903. In a case where charge accumulating region 903 is constituted of a nitride film or the like, electrons trapped in charge accumulating region 903 do not move over a long distance to be localized in the vicinity of impurity region 901.

A state where electrons have been injected into charge accumulating region 903 is hereinafter referred to as written state (programmed state). In the written state, since electrons are accumulated in charge accumulating region 903, the memory cell transistor has a high threshold voltage (provided that the memory cell transistor is of an N-channel type).

FIG. 21 is a diagram showing an example of applied voltages to a memory cell when electrons are extracted from charge accumulating region 903. There are various ways for erase operations. In FIG. 21, there are shown applied voltages employed in a substrate erasure method in which electrons are ejected into a substrate region.

In FIG. 21, when electrons are extracted from charge accumulating region 903, control gate electrode 904 is supplied with, for example, a negative voltage of –5 V and impurity regions 901 and 902 are supplied with a voltage in the range from 5 to 6 V. In this case, substrate region 900 is supplied with a voltage at a level similar to the voltage of impurity regions 901 and 902. In this state, electrons (e–) accumulated in charge accumulating region 903 are ejected to substrate region 900 through a Fouler-Nordheim (FN) tunnel current. This state is usually called an erased state, where a threshold voltage decreases.

As an erase operation for a non-volatile memory cell, there are available a method in which channel hot holes are injected into charge accumulating region 903, and a method in which electrons are extracted from charge accumulating region 903 to gate electrode 904 and others.

By a quantity of charges stored in charge accumulating region 903, as shown in FIGS. 20 and 21, a threshold voltage of the memory cell transistor changes, and the threshold voltage is correlated with data. Therefore, since a threshold voltage changes consecutively according to a quantity of electric charges stored in charge accumulating region 903, the non-volatile memory cell can store multi-valued data.

FIG. 22 is a diagram schematically showing applied voltages when data is read from the non-volatile memory cell. In FIG. 22, control gate electrode 904 is supplied with a read voltage Vread, while impurity region 901 is supplied with ground voltage. Impurity region 902 is supplied with a bit current Ib1. Read voltage Vread is set to an intermediate voltage level between threshold voltages in erased state and written state, or a voltage level higher than a threshold voltage in written state.

When read voltage Vread is set to an intermediate value between a threshold voltage in erased state and that in written state, the memory cell transistor in erased state is turned on, while the memory cell transistor in written state is turned off. Substantially no bit current Ib1 flows through the memory cell in the written state.

When read voltage Vread is set to a voltage level higher than a threshold voltage in the written state, a current flows through the memory cell in any of erased state and written state. Threshold voltages in erased state and written state are different from each other, and therefore, a channel resistance of the memory cell transistor is different according to whether the memory cell transistor is in the erased state or in the written state, and a current flowing through the memory cell transistor is made different in magnitude, accordingly. Therefore, by detecting a quantity of current through a bit line, a state of the memory cell, or stored data can be detected.

FIG. 23 is a diagram schematically showing data storage regions in a case where charge accumulating region 903 is constituted of a nitride film. In FIG. 23, in a case where charge accumulating region 903 is constituted of a nitride film, an oxide film 908 is formed between control gate electrode 904 and charge accumulating region 903 and an oxide film 909 is formed between charge accumulating region 903 and semiconductor substrate region 900. In charge accumulating region 903, there are formed data storage regions BTR and BTL. In a case where charge accumulating region 903 is made of a nitride film, an electron mobility is very low, and the data storage regions are formed being localized in charge accumulating region 903. When electrons are injected into data storage region BTR (right bit region), a current I is conducted from impurity region 902 to impurity region 901. In this state, hot electrons are generated by a high drain electric field formed in the vicinity of impurity region 902 and the hot electrons are accelerated by a high electric field formed by a voltage on the control gate and trapped in data storage region BTR of charge accumulating region (nitride film) 903.

When electrons are injected into data storage region (left bit region) BTL, a current is conducted from impurity region 901 to impurity region 902. Hot electrons are generated by a high drain electric field formed in the vicinity of impurity region 901 and electrons are accumulated into data storage region (left bit region) BTL of charge accumulating region 903.

When data stored in right bit region BTR is read, current I is conducted from impurity region 901 to impurity region 902. In this case, in the vicinity of impurity region 901, a punch-through occurs by a drain high electric field and a depletion layer is merely widened. Electrons stored in left bit region exerts no influence on a channel current and a current flows from impurity region 901 to impurity region 902 according to a quantity of electrons stored in right bit region BTR.

In contrast, when data stored in left bit region BTL is read, a current is flowed from impurity region 902 to impurity region 901. In this case, in the vicinity of impurity region 902, a punch-through occurs by a drain high electric field and electrons stored in data accumulating region (right bit region) BTR exerts no influence on reading storage data from data storage region BTL. Therefore, a quantity of current flowing from impurity region 902 to 901 is determined according to a quantity of electrons stored in left bit region BTL.

In a case where a nitride film is used as charge accumulating region 903, two data storage regions BTR and BTL can be formed in 1-bit memory cell. Therefore, a multi-valued memory cell can be implemented, which stores 2 bit data in one-bit memory cell, thereby enabling a large capacity memory device to be achieved in a small occupation area.

In a non-volatile memory cell, a high electric field is applied to accumulate electrons in charge accumulating region 903. Therefore, if writing/erasing are repeatedly performed, an insulating film in an electron accumulating region or in an electron passing-through region would be deteriorated, to cause a problem of a change in data holding characteristic of a memory cell. Deterioration in memory cell characteristic associated with increase in number of write/erase cycles of a memory cell transistor occurs in a collective erase type memory (flash memory) having a charge accumulating region made of polysilicon and in an insulating film electric charge trapping memory trapping electrons in an insulating film. In a memory device storing data by trapping electrons in an insulating film, however, a quantity of accumulated electrons is smaller compared with that in a general stacked gate transistor having a polysilicon floating gate. Therefore, such deterioration in data retention characteristic would be more remarkable as the increase in number of write/erase cycles. First, description will be given of a case of an insulating film charge trapping type memory device having a charge accumulating region formed of an insulating film.

When an erase/write is repeated, a threshold voltage of a memory cell in the written state is some case rendered lower than a threshold voltage in the written state at an initial stage. As causes for such decrease of the threshold voltage, the following may be considered. An excessively decreased threshold voltage in erasure reduces the threshold voltage after writing by the excessively decreased amount. Electrons trapped in an insulating film leak out due to deterioration in the insulating film and an oxide film to lower the threshold voltage. Furthermore, in a case of the leakage of electrons, electrons would be trapped in an oxide film to reduce the a voltage applied on a control gate in writing effectively, and a sufficient electric field is not applied between a nitride film and a substrate region, to hinder accumulation of a sufficient amount of electrons in the charge accumulation.

In contrast, a case exists where after an erase/write is repeated, a threshold voltage of a memory cell in erased state is raised to be higher than a threshold voltage of a memory cell in erased state at an initial stage. As for causes for this phenomenon, the following phenomena may be considered. Electrons accumulated in a nitride film move toward the center of the nitride film and a quantity of electrons accumulated in the central portion of the nitride film is increased as the number of cycles increases, thereby raising a threshold voltage of the memory cell. As the second, electrons are continuously kept being trapped in an oxide film and electrons can not be extracted from the nitride film sufficiently.

In U.S. Pat. No. 6,222,768, for example, there are proposed a construction for performing writing, erasure and reading data with correctness while compensating for deterioration in memory cell characteristic (a change in threshold voltage characteristic) occurring with increase in number of write/erase cycles.

FIG. 24 is a diagram schematically showing a configuration of a main part of a non-volatile semiconductor memory device shown in the above described prior art reference. In FIG. 24, the non-volatile semiconductor memory device includes: a memory cell array 910 having a plurality of non-volatile memory cells arranged in rows and columns; an I/V converter 912 converting a current Imen flowing through a bit line having a selected memory cell in the memory cell array 910 connected to a voltage Vmem; a reference current generating circuit 915 for generating a reference current Iref; an I/V converter 917 for converting reference current Iref to a reference voltage Vref, and a comparator 920 for comparing reference voltage Vref with memory read voltage Vmem to generate a signal indicating a state of a memory cell according to a result of the comparison.

In the configuration shown in FIG. 24, current Imem flowing through selected memory cell in memory cell array 910 is converted into memory read voltage Vmem by I/V converter 912 and memory read voltage Vmem is compared with reference voltage Vref converted by I/V converter 917, and determination is made on whether the memory cell is in erased state or in written state.

FIG. 25 is a diagram schematically showing a configuration of memory cell array 910 shown in FIG. 24. Memory cell array 91 has nonvolatile memory cells MC arranged in rows and columns, and in FIG. 25, there are shown memory cells MC arranged in two rows and three columns representatively. Word lines WL0 and WL1 are provided corresponding to respective rows of memory cells MC and bit lines BL0 to BL3 are provided correspondingly to columns of memory cells MC.

Bit lines BL0 to BL3 each are shared by memory cells on adjacent columns. A memory cell MC is constituted of an insulating film charge trapping memory cell and has data storage regions BTR and BTL.

Bit lines BL0 and BL2 are coupled to a global bit line GBLA through select gates TG0 and TG1, respectively and bit lines BL1 and BL3 are coupled to a global bit line GBLB through select gates TG2 ad TG3, respectively. Select signal SL0 to SL3 are applied to select gates TG0 to TG3, respectively.

Each of bit lines BL0 to BL3 is formed of a diffusion layer. Since no contact is provided for connection of a memory cell to a bit line in the memory cell array and a bit line is formed by memory cells on adjacent columns, an occupation area of a memory cell is $4 \times F^2$. Here, F indicates the minimum design size. A pitch of bit lines and a pitch of word lines are both indicated by F. Since one memory cell MC stores 2 bit data, an effective memory cell area is $2 \times F^2$.

In data reading (including a verify operation), bit lines each connecting to a selected memory cell are connected to global bit lines GBLA and GBLB. One of global bit lines GBLA and GBLB is supplied with power supply voltage according to which stored data of data storage regions BTL and BTR is read out. The other global bit line is coupled to I/V converter 912 as described later.

Power supply voltage is transmitted to a selected bit line (a bit line located farther away from a data storage region) through corresponding select gates TG0 to TG3. A voltage at the drain of a memory cell connected to the select bit line is at a voltage level lower than power supply voltage by a threshold voltage of the select gate because of a threshold voltage loss in the select gate. A current flows in the memory cell according to stored data owing to the drain voltage. In FIG. 25, there is typically shown a path through which global bit line GBLA is supplied with power supply voltage and memory cell current Imem flows into global bit line GBLB through bit lines BL2 and BL1.

Global bit line GBLB is further selected by a column select gate not shown and coupled to I/V converter 912 shown in FIG. 24.

In the prior art, when a verify failure occurs in a verify operation after erasure, erase and verify operations are repeatedly performed till the number of times of erase pulse application reaches the maximum number thereof. When the number of times of verify failures reaches the maximum allowable number, reading is performed on a threshold voltage of a reference memory cell stored in a register provided in a reference current generating circuit 915. The reference memory cell is placed outside the memory cell array, is in the erased state due to the erasure during erase verify operation and data indicating a threshold voltage of the reference memory cell is stored in the register. The threshold voltage of the reference memory cell can be incremented (a write operation is performed) till the threshold voltage of the reference memory cell stored in the register reaches the maximum value.

Voltage levels of a read voltage and a verify voltage outputted by I/V converter 917 are determined according to a threshold value of the reference memory cell. Therefore, as shown in FIG. 26, when the number of times of verify failures reaches the maximum allowable number, a reference voltage window for the memory cell is changed. In FIG. 26, there is shown, by way of example, a state where reference voltages Vref for writing, reading and erasure of 3 V, 2 V and 1 V, respectively are incremented, after adjustment, to 3.2 V, 2.2 V and 1.2 V, respectively.

Even if a write/erase cycle is repeatedly performed and memory cell characteristics are deteriorated to vary the threshold voltage, by changing reference voltage Vref window, a reference voltage window adapted to the varied memory cell characteristics can be produced intending to perform write/erasure correctly.

In the above conventional construction, a threshold voltage of a reference memory cell is incremented by a prescribed step to perform a further erase verifying when an erase verify failure occurs a prescribed number of times in an erase cycle. Therefore, a window of a threshold voltage for a memory cell of an erasing target is shifted when an erase verify failure occurs The shift in threshold voltage is performed commonly on all of memory cells, standing on the premise that as the number of times of writing/erasure increases, threshold voltages of all of the memory cells rises uniformly.

Memory cells are, however, not the same in number of times of writing/erasure (rewriting), but are variant in the number times of rewriting as well as in memory cell characteristic. Therefore, even the memory cells storing data of the same logical level have variant threshold voltages Accordingly, in a case where a window of a verify voltage is increased, there exists a memory cell having a relatively low threshold voltage even in the written state among the memory cells not subject to rewriting. Therefore, read failure is likely to occur due to margin shortage when a window of verify voltages is shifted in common to all the memory cells.

Specifically, consideration is now given of a distribution of memory cells storing data "0" and "1" as shown in FIG. 27. Data "1" corresponds to the erased state and memory cells storing data "1" each have a threshold voltage between an upper side erase verify voltage Veu and a lower side erase verify voltage Vel.

A memory cell storing data "0" corresponds to a memory cell in the written state (programmed state) and has a threshold voltage equal to or higher than lower side write verify voltage Vp1.

When data is read, by way of example, read voltage Vread, at a voltage level between upper side erase voltage Veu and lower side write verify voltage Vp1, is applied. Under this state, a window of a verify voltage and a read voltage are applied. A threshold voltage of a memory cell subject to rewriting shifts in the high voltage direction in FIG. 28 with respect to the voltage V both in the erase region and in written region. A memory cell not subject to rewriting has a threshold voltage unchanged. Here, rewriting indicates an erase operation or a write operation.

In FIG. 28, since a verify voltage is shifted, upper side erase verify voltage Veus and lower side write verify voltage Vp1s are used. Instead of read voltage Vread, a shifted read voltage Vreads is used according to a shift in the verify voltage. All memory cells have the storage data rewritten in the same rewrite cycle, but an addressed memory cell has the storage data rewritten. Therefore, a threshold voltage distribution is further broadened in width compared with a state shown in FIG. 27. Among the memory cells in the written state, a memory cell with a relatively low threshold voltage in written state is small in difference between the threshold voltage thereof and shifted read voltage Vreads, and small in margin for data reading, impeding correct data reading.

Furthermore, since a verify voltage window is shifted uniformly for all of memory cells, a memory cell, small in number of times of rewriting and causing no deterioration of memory cell characteristic, has a threshold voltage thereof sifted upward to a higher voltage. Therefore, when a memory cell, smaller in number of times of rewriting, in the erased state is set into written state, a shift amount in threshold voltage is greater as compared with a memory cell greater in number of times of rewriting, and accordingly has an increased number of times of rewrite pulse application. Accordingly, a characteristic of an insulating film of a memory cell smaller in number of times of rewriting tends to be deteriorated. In other words, when a verify voltage window and the read voltage are shifted commonly for all of memory cells, a characteristic of a memory cell small in number of times of rewriting is adjusted according to a characteristic of a memory cell greater in number of times of rewriting. Therefore, characteristics of all of the memory cells in the non-volatile semiconductor memory device are set according to the worst memory cell characteristic, resulting in promotion of deterioration in characteristics of memory cells as a whole.

In this prior art technology, a threshold voltage of a reference memory cell is changed by a prescribed step in reference current generating circuit 915. In this prior art reference, however, no detailed description is given of how a threshold voltage of the reference memory cell in reference current generating circuit 915 is shifted. With increase in the number of times of rewriting, the reference memory cell transistor has the memory cell characteristic changed. Therefore, an amount of shift would be varied even by application of the same rewrite pulse, and therefore, desired threshold voltage shift could not be provided correctly at all times.

In this prior art reference, the reference memory transistor for generating a reference current is provided for reading, for writing and for erasure separately. In a case where a plural kinds of such reference memory transistors are provided outside the memory cell array and have the respective threshold voltages adjusted in accordance with an operation mode, the control becomes complex. In addition, it is very difficult to form memory cell transistors the same in characteristic as memory cell transistors outside the memory cell array. This is because a peripheral layout pattern of the reference transistors is greatly different from that of the memory cell array section.

Furthermore, in this prior art reference, consideration is given only to a threshold voltage shift in a higher level direction with the increase in number of times of rewriting, and no consideration given to the phenomenon that a threshold voltage of a memory cell in written state is reduced below a desired value due to deterioration in insulating film. Therefore, in a case where a threshold voltage in written state is decreased due to a change in memory cell characteristic with increase in number of times of rewriting, there is a possibility that the written state of such memory cell is erroneously determined as the erased state when shifted read voltage Vreads as shown in FIG. 28 is applied The above problem also similarly arises in a case where read voltage Vread is set to a level higher than a threshold voltage of a memory cell in written state and a difference between currents of the memory cells in written state and in erase state is utilized. Specifically, in a construction in which a voltage for data reading including a verify operation is set commonly to all of memory cell, a threshold voltage difference would be small between a memory cell having a highest threshold voltage among the memory cells in the erase state and a memory cell having a lowest threshold voltage among the memory cells in the written state, and data can not be read correctly. In other words, in data reading, a reference current (or a reference voltage) in reading is set to an intermediate level between a current flowing in a memory cell in the erased state and a current flowing in a memory cell in the written state. In such a construction, when the reference current is shifted toward a higher level, a difference between a memory cell current flowing in a memory cell in the written state and the reference current becomes smaller, and correct reading of data could not be achieved.

The issue of the above deterioration in memory cell characteristic associated with increase in number of times of rewriting similarly occurs in a memory cell having a polysilicon floating gate, since deterioration occurs in a tunnel insulating film with increase in the number of times of rewriting.

SUMMARY OF THE INVENTION

It is an object of the present invention to provide a semiconductor memory device capable of correctly reading stored data in a memory cell.

It is another object of the present invention to provide a non-volatile semiconductor memory device capable of correctly reading data in accordance with a comparison with a reference current regardless of the number of times of rewriting of a memory cell.

A non-volatile semiconductor memory device according to a first aspect of the present invention includes: a plurality of non-volatile memory cells, each formed of a memory cell transistor having a threshold voltage changed in accordance with stored data, for storing data in a non-volatile manner; a detection circuit for detecting and storing a change in threshold voltage characteristic of the plurality of non-volatile memory cells; a read circuit for reading stored data in a selected memory cell of the plurality of non-volatile memory cells in accordance with comparison of a read current corresponding to a current flowing in the selected memory cell and a reference current; and a reference current control circuit for setting a quantity of the reference current in accordance with a result of the detection by the detection circuit.

A semiconductor memory device according to a second aspect of the present invention includes: a plurality of memory cells arranged in rows and columns; a plurality of bit lines, provided corresponding to the memory cell columns, each connecting to the memory cells on a corresponding column; a plurality of sense amplifiers coupled commonly to a selected bit line coupled to an addressed memory cell, for amplifying data in the addressed memory cell appearing on the selected bit line when activated; and a sense control circuit for controlling operations of the plurality of sense amplifiers in different ways from each other.

A semiconductor memory device according to a third aspect of the present invention includes: a plurality of memory cells; a reference circuit for generating and outputting reference data; an internal read circuit for comparing data read from a selected memory cell out of the plurality of memory cells with the reference data and reading data in the selected memory cell on the basis of a result of the comparison; and a reference data change circuit for selectively changing, in a specific operation mode, selectively set conditions for reference data outputted by the reference circuit in accordance with an address signal of the selected memory cell.

By detecting and storing a change in threshold voltage characteristic of a memory cell to selectively change a reference current serving as a reference for data reading in accordance with a result of the storage, a reference current corresponding to a state of a selected memory cell can be generated. Individual memory cell data can be read out with a sufficient margin for a read current ensured. Accordingly, data can be correctly read even in deterioration of a memory cell characteristic, regardless of a change in threshold voltage characteristic without exerting an adverse influence on reading data from a normal cell.

Furthermore, a plurality of sense amplifiers are commonly to a selected bit line and are made different in control manners from each other. Thus, a so-called "multi-sensing" can be performed and data can be read correctly. In addition, a state of a threshold voltage of a memory cell can be identified accordance with coincidence/non-coincidence between output signals of the plurality of sense amplifiers. Accordingly, a memory cell having a threshold voltage shifted with respect to data at the same logical level can be detected and an appropriate measure can be taken for such detected memory cell. Moreover, by changing the set conditions for reference data in a specific operation mode on the basis of an address of a selected memory cell, read conditions meeting a characteristic of each individual memory cell can be set, and memory cell data can be read correctly without exerting an adverse influence on reading data from a normal memory cell even when a memory cell is deteriorated in characteristic.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram schematically showing a configuration of a main part of a semiconductor memory device according to a first embodiment of the present invention;

FIGS. 3A and 3B are graphs illustrating relationships between a residual current and a reference current when a threshold voltage is abnormal;

FIG. 5 is a diagram showing one example of configuration of a latch sense amplifier shown in FIG. 4;

FIG. 9 is a table showing, in a list form, contents of processing for a threshold voltage abnormality in the first embodiment of the present invention;

FIG. 14 is a flowchart showing an erase operation in the non-volatile semiconductor memory device in the first embodiment of the present invention;

DESCRIPTION OF THE PREFERRED EMBODIMENTS

First Embodiment

Figure 23:
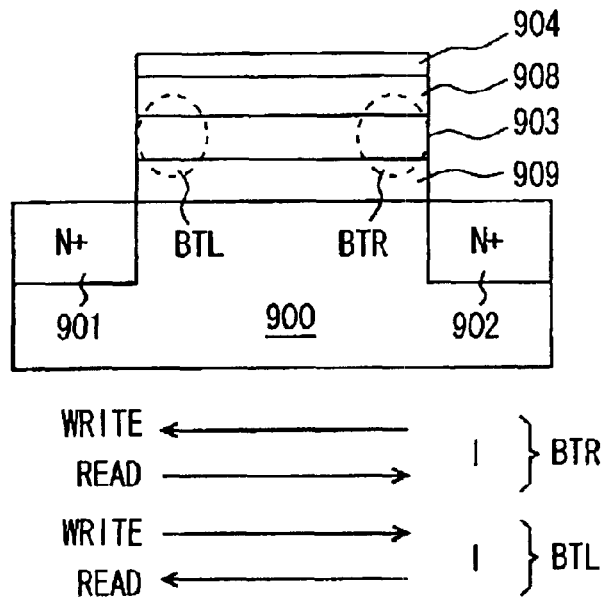
FIG. 23 is a diagram showing a sectional structure of a conventional insulating film charge trapping memory cell and directions of write (program) current and read current in the memory cell.
Figure 24:
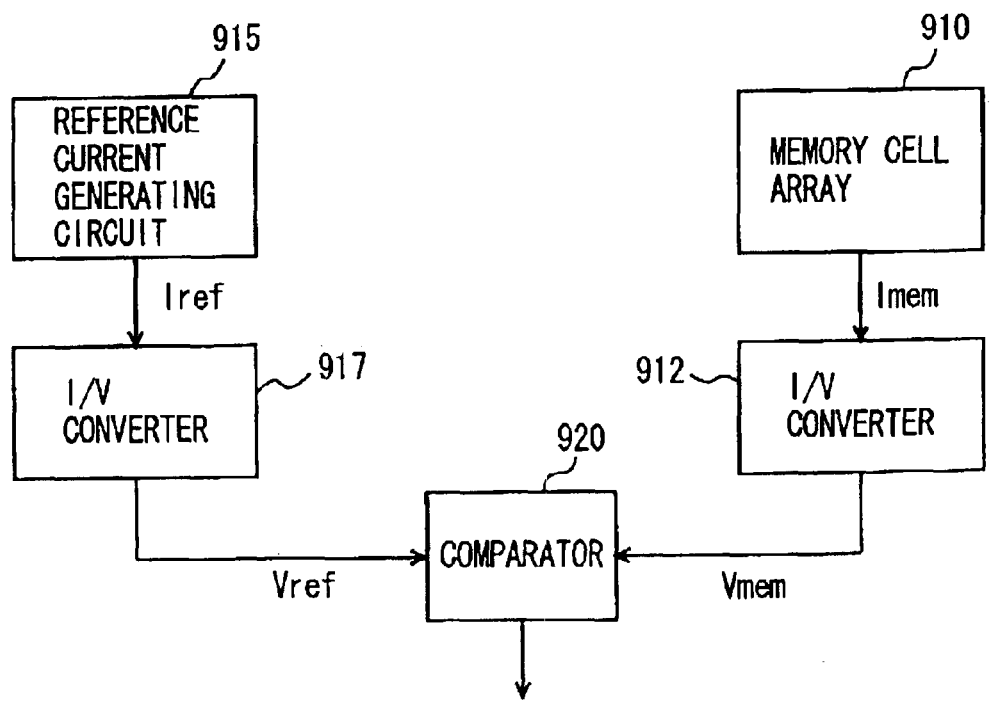
FIG. 24 is a diagram showing a configuration of data reading section of a conventional non-volatile semiconductor memory device.
Figure 25:
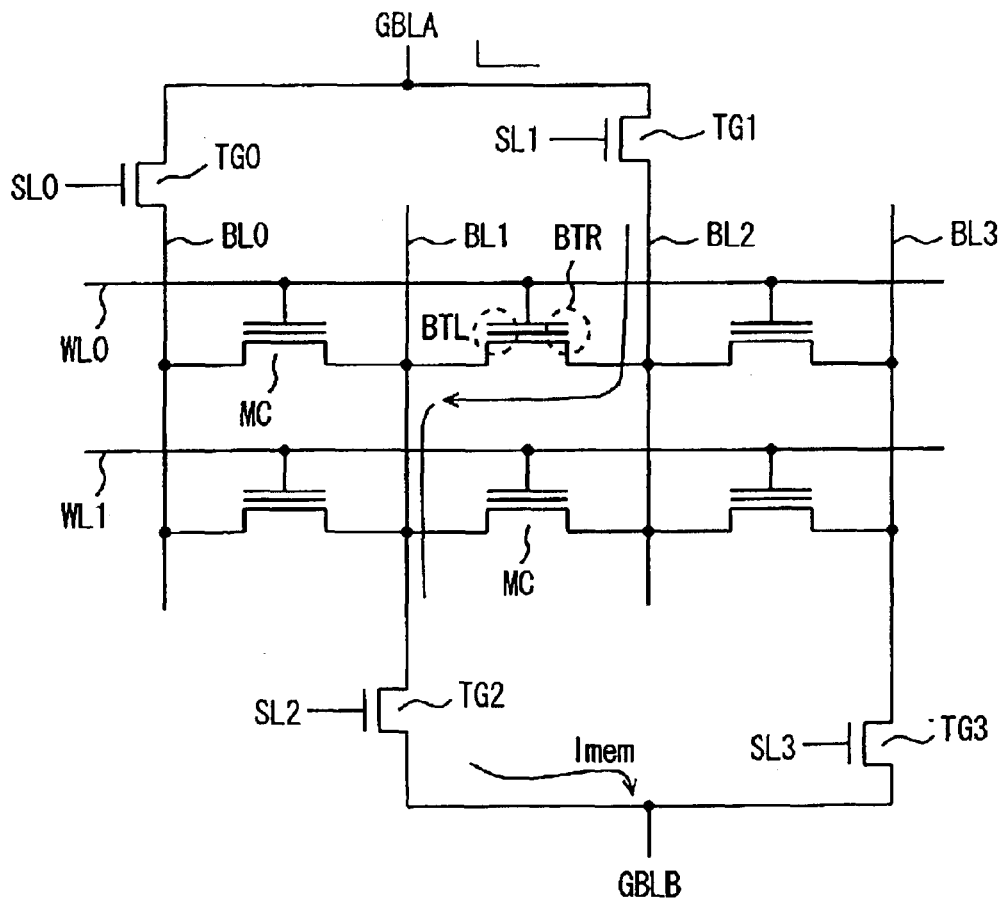
FIG. 25 is a diagram schematically showing a configuration of a memory cell array shown in FIG. 24.
Figure 26:
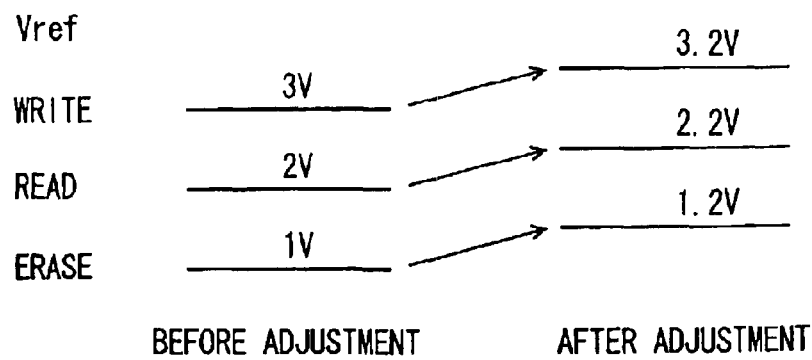
FIG. 26 is an illustration showing reference voltages shown in FIG. 24 and adjusted voltages thereof.
Figure 27:
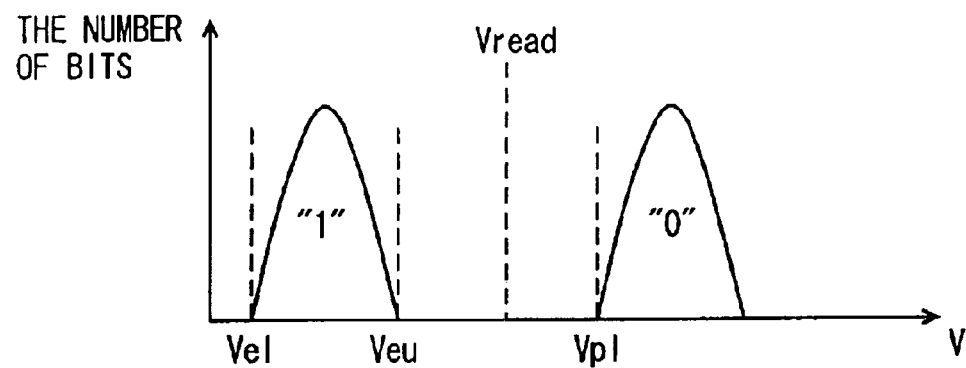
FIG. 27 is a graph illustrating threshold voltage distributions of a conventional non-volatile memory cell.
Figure 28:
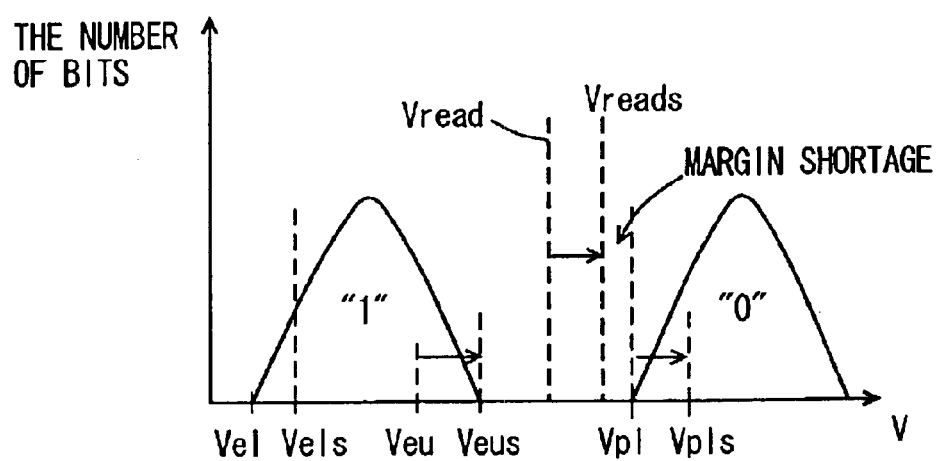
FIG. 28 is a diagram used for describing a problem point in read voltage adjustment in a conventional non-volatile semiconductor memory device.

FIG. 1 is a diagram schematically showing a configuration of a main part of a non-volatile semiconductor memory device according to a first embodiment of the present invention. In FIG. 1, non-volatile memory cells MC are arranged in rows and columns. A non-volatile memory cell MC has a memory cell construction shown in FIG. 23, and includes two data storage regions (a right bit region and a left bit region) BTL and BTR. In FIG. 1, there are shown representatively memory cells arranged in six rows and eight columns.

Word lines WL0 to WL5 are provided corresponding to the respective rows of memory cells. Word lines WL0 to WL5 are connected with control gate electrodes of memory cells on corresponding rows. In erase operation, collective erasure in units of word lines may be performed or alternatively, erasure may be performed for each cell by injection of hot electrons using a drain high electric field.

To word lines WL0 to WL5 are provided with X decoders XD0 to XD5, respectively, which in turn transmits, when selected, a voltage supplied to an operating power supply node to corresponding word lines according to an address signal (or a predecode signal) not shown. Write voltage VWG is supplied to operating power supply nodes of X decoders XD0 to XD5 through a power supply transistor PG0 rendered conductive according to a write instructing signal WRT. Read voltage VRG is supplied, in reading, to the operating power supply nodes through a power supply transistor PG1 rendered conductive according to a read instruction signal. RED. Read voltage VRG is applied not only in an ordinary data read mode when data is read out externally, but also applied as a verify voltage in verify operation for internally verifying the written/erases state, and is set to a different voltage level according to an operation mode.

In rewrite operation as well, write voltage VWG is set to an erase voltage level in an erase mode, while being set to a write voltage level in a write mode, wherein the erase and write voltage levels are different from each other.

Bit lines BL0 to BL7 and BLs are provided corresponding to memory cell columns. Bit line BLs is a spare bit line and memory cells connected to bit line BLs are used as spare cells (redundant cells) for repairing a defective bit. Bit lines BL0 to BL7 each are shared by memory cells on adjacent columns. In reading data from a memory cell (including verify operation), bit lines of one pair provided corresponding to a selected column are selected and one bit line is couple to receive a read current and the other bit line is coupled to ground voltage level. The bit line coupled to ground voltage level is referred to as a "virtual source line."

Bit lines BL0 to BL7 are coupled electrically to an internal write data bus VWD through write column select gates G0 to G7 rendered conductive in response to write column select signals /WA0 to WA7, and coupled electrically to an internal read data bus VRD through read column select gates RG0 to RG7 made conductive in response to read column select signal /RA0 to /RA7. Similarly, spare bit line BLs is coupled to internal write data bus VWD through a spare write column select gate Gs made conductive in response to a spare write column select signal /WAS, and coupled to internal read data bus VRV through a spare read column select gate RGs responsive to a spare read column select signal /RAS.

In FIG. 1, column select gates G0 to G7 and Gs, and RG0 to RG7 and RGs are each depicted being formed of a P-channel MIS transistor (insulated gate field effect transistor). Read column select gates RG0 to RG7 and RGs each may be constituted of an N-channel MIS transistor. Write column select gates G0 to G7 and Gs each may be constituted of an N-channel MIS transistor as well if write column select signals /WA0 to /WA7 and /WAs can be driven to a voltage level higher than a high voltage transmitted in writing.

In FIG. 1, internal write data bus VWD is constituted of write data lines of one pair and bit lines BL0 to BL7 and BLs are alternately coupled to different internal write data lines. Internal read data bus VRD is also constituted of internal read data lines of one pair and bit lines BL0 to BL7 and BLs are alternately coupled to different internal read data lines. This is because it is required to select bit lines of one pair simultaneously in selection of a memory cell and to apply voltages at prescribed levels to a selected bit line pair, respectively, according to an operating mode.

A write current switch 8 is provided to internal write data bus VWD. Write current switch 8 switches the route supplying the rewrite voltages according to which data of data storage regions BTL and BTR is rewritten (written/erased). The switching of the paths for rewrite voltage is determined according a signal indicating whether a select bit line is even or odd and whether a data rewrite region is right bit region BTR or left bit region BTL.

To internal read data bus VRD, there are provided: a read current supply circuit 1 for supplying a current to a selected memory; a reference current generating circuit 2 for generating a comparison reference current Iref in data reading; sense amplifiers 3 and 4 being different in activation timings from each other, for comparing a current flowing in read data bus VRD and comparison reference current Iref from reference current generating circuit 2 when activated; and a control circuit 5 for adjusting a current quantity of comparison reference current Iref generated by reference current generating circuit 2 according to output signals of sense amplifiers 3 and 4.

Control circuit 5 is constituted of a processing device such as a sequence controller, for example, generates a necessary voltage according to an internal operating mode softwarewise and determines a voltage generating timing and a memory cell select timing. Control circuit 5 also controls operations of sense amplifiers 3 and 4 and further controls an operation of write current switch 8 (a control path for the write switch is not shown).

In the configuration shown in FIG. 1, sense amplifiers 3 and 4 are coupled commonly to internal read data bus VRD. By making operating timings of sense amplifiers different from each other, difference is caused between sense margins of these sense amplifiers. Specifically, the difference between reference current Iref from reference current generating circuit 2 and a current in internal read data bus VRD at sense start is made different between sense amplifiers 3 and 4. With difference in sense margin between sense amplifiers 3 and 4, a change in threshold voltage characteristic of a selected memory cell can be detected. Accordingly, a magnitude of comparison reference current Iref generated by reference current generating circuit 2 is adjusted according to the direction in which a threshold voltage varies due to the change in characteristic. Thus, there can be generated a reference current adapted to a threshold voltage characteristic of each selected memory cell, and correct reading of data (including a verify operation) can be performed. Here, the term "threshold voltage characteristic" indicates a variation (shift) in threshold voltage for data at the same logical level.

Figure 2:
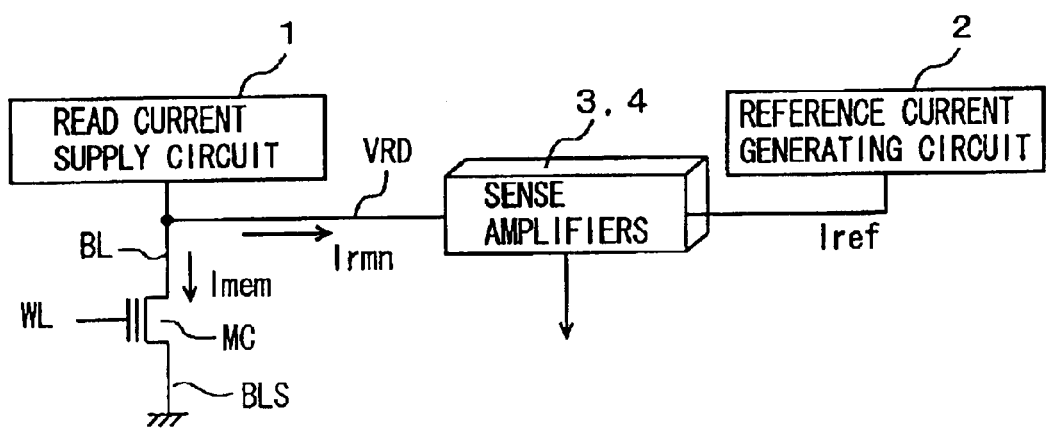
FIG. 2 is a diagram schematically showing a configuration of a part related to reading of memory cell data in the non-volatile semiconductor memory device shown in FIG. 1.

FIG. 2 is a diagram schematically showing a configuration of a part associated with the sense amplifiers shown in FIG. 1. In FIG. 2, a read current supply circuit 1 includes a constant current generating circuit and supplies a constant current onto internal read data bus VRD. A bit line BL is connected to internal read data bus VRD through a read column select gate not shown. A memory cell MC connected to bit line BL is coupled to ground node through a virtual source line BSL. When a current is supplied to a selected memory cell in data reading, a current is conducted according to a reverse scheme in which a current flows from a bit line farther away from a data storage region from Which data is read out toward the data storage region of interest.

A read voltage applied to ward line WL to which memory cell MC is connected may be higher than any of both of a high threshold voltage and a low threshold voltage of memory cells or alternatively, may be set at an intermediate voltage level between the high and low threshold voltages. In any of the constructions, a difference arises in memory cell current Imem flowing through bit line BL according to stored data in memory cell MC.

A remaining current (hereinafter referred to as a residual current) Irmn excluding memory cell current Imem in the constant current supplied by read current supply circuit 1 flows into internal read data line VRD and supplied to sense amplifiers 3 and 4. Reference current Iref from reference current generating circuit 2 is supplied to sense amplifiers 3 and 4. Reference current Iref is set intermediate between a residual current when a memory cell in a high threshold voltage state is selected and a residual current when a memory cell in a low threshold voltage state is selected. By making margin for residual current and comparison reference current Iref different between sense amplifiers 3 and 4 from each other, detection is made on the presence or absence of a change in characteristic of a memory cell MC. In detection of change in characteristic, a magnitude of reference current Iref is changed so as to compensate for the change in threshold voltage characteristic to ensure a margin in data reading.

FIGS. 3A and 3B are graphs schematically illustrating an adjustment scheme of a comparison reference current according to the first embodiment of the present invention. In each of FIGS. 3A and 3B, the ordinate indicates a current value i, and the abscissa represents the number of erase/write (program) cycles.

Here, such a construction is assumed that in a memory cell in the written state, the memory cell has a threshold voltage equal to or higher than a read voltage applied to the control gate thereof and the read voltage is applied so as to cause substantially no current flow through a selected memory cell in the written state.

In FIG. 3A, when the number of erase/write cycles is small, a memory cell characteristic maintains substantially constant with no change in threshold voltage characteristic. Accordingly, residual current Irmn(P) in written state (a high threshold voltage state) is at a current level close to a constant current supplied from read current supply circuit 1 with substantially no change in magnitude. Similarly, residual current Irmn(E) in erased state (a low threshold voltage state) makes substantially no change. Comparison reference current Iref is set to an intermediate level between residual currents Irmn(P) and Irmn(E).

Consideration is given to a case where the number of erase/write cycles increases and a change occurs in memory cell characteristic. Further, the following state is considered in which under the change of the memory cell characteristic, a data holding characteristic is deteriorated and a threshold voltage of a memory cell in a high threshold voltage state is reduced due to leakage of electrons. In this case, current Imem flowing through a memory cell increases, and residual current Irmn (P), in response, decreases. Therefore, a difference MGA between comparison reference current Iref and residual current Irmn (P) is reduced, and a sense margin is smaller, leading to a possibility of occurrence of incorrect reading. In this case, comparison reference voltage (reference current) Iref is reduced and a difference (a margin) to residual current Irmn (P) is increased by reference current reduction quantity MGB.

On the other hand, as for a memory cell causing no deterioration of memory characteristic, a sufficient margin is available, and a current level of comparison reference current Iref is not changed. By decreasing comparison reference current Iref, a state where a threshold voltage of a memory cell is lowered is realized on the comparison reference side, thereby enabling generation of comparison reference current Iref meeting a memory cell characteristic.

On the other hand, as shown in FIG. 3B, if a characteristic of an insulating film changes with increase in number of erase/write cycles, and electrons are trapped in an oxide film, or electrons move in a nitride film from a data storage region to the central region of the nitride film to be trapped, a threshold voltage of the memory cell is raised. In this case, a threshold voltage of a memory cell in a low threshold state rises and a difference MGC between comparison reference current Iref and residual current Irmn (E) is decreased. In this case, comparison reference current Iref is increased, and a difference (a margin) to residual current Irmn (E) is increased by the increment MGC. Thereby, a state where a threshold voltage of a memory cell is raised is realized equivalently, thereby enabling accommodation for increase in threshold voltage of a memory cell.

On the other hand, a threshold voltage of a normal memory cell is in a low state, and comparison reference current Iref is not changed for such normal memory cell. Therefore, by adjusting a magnitude of reference current Iref according to a characteristic of a memory cell, the following advantage can be provided, compared with a construction in which reference current Iref is commonly changed uniformly on all the memory cells.

That is, in a case where a threshold voltage is lowered due to change in characteristic, if the reference current Iref is reduced for all the memory cell commonly, a threshold voltage is generally raised with increase in number of erase/write cycles (in FIG. 3A, a threshold voltage of a memory cell in the erased state increases with increased in number of rewrite cycles), and therefore, a margin for a memory cell in a low threshold state decreases, and a possibility is increased that incorrect reading occurs, especially, on a memory cell having a threshold characteristic as shown in FIG. 3B. Similarly, in a case where a threshold voltage is raised, if the comparison reference current Iref is increased for all the memory cells commonly, a margin for residual current Irmn(P) of a memory cell in a high threshold voltage state is reduced smaller, leading to a possibility to produce a wrong reading. Therefore, by changing a magnitude of comparison reference current Iref according to a characteristic of a memory cell, correct reading of data can be made for both of a normal memory cell and a memory cell having a deteriorated characteristic.

In a case where a read voltage is at a verify voltage in data reading, correct erasure/writing (programming) can be performed and besides, correct reading of data is can be made even in instruction of external data read.

Figure 4:
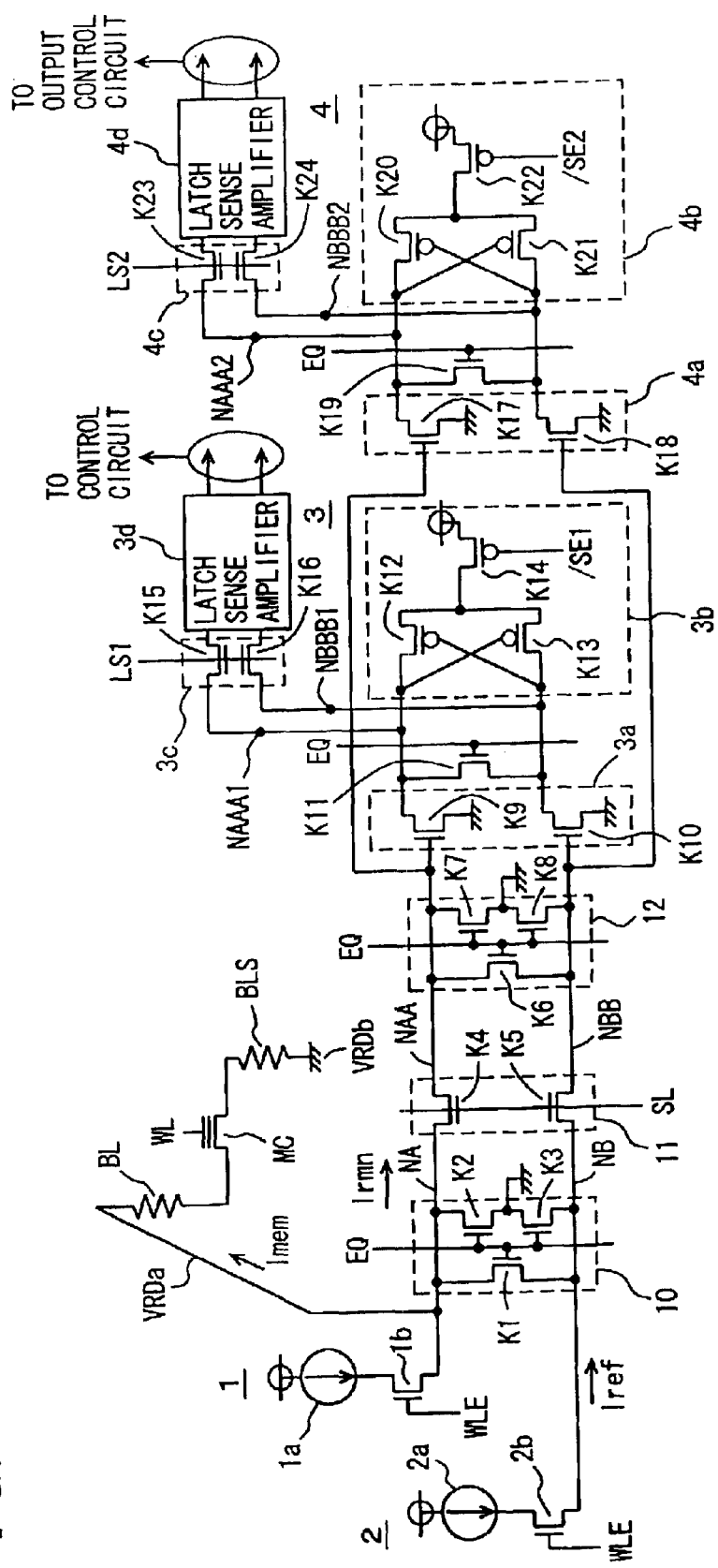
FIG. 4 is a diagram showing more specifically a configuration of a part related to data reading of the non-volatile semiconductor memory device according to the first embodiment of the present invention.

FIG. 4 is a diagram showing an example of a configuration of sense amplifiers 3 and 4, read current supply circuit 1 and reference current generating circuit 2 according to the first embodiment of the present invention. In FIG. 1, a read column select gate is not shown for simplification of the figure.

In FIG. 4, memory cell MC is connected to an internal read data line VRDa through bit line BL, and coupled to an internal read data line VRDb through virtual source line BSL. A current from read current supply current 1 is supplied to internal read data line VRDa and internal read data line VRDb is grounded. A connection path between internal read data lines VRDa and VRDb and read current supply circuit 1 is determined according to which of right bit region and left bit region of a memory cell is read out.

Read current supply circuit 1 includes: a constant current source 1*a* supplying a constant current; and a transfer gate 1b transmitting a constant current from constant current source 1a to internal read data line VRDa in response to activation of a word line activation signal WLE. Word line activation signal WLE determines a period during which a word line is in a selected state and word line WL is maintained in selected state during a period when word line activation signal WLE is in active state.

Reference current generating circuit 2 includes: a constant current source 2a supplying a constant current; and a transfer gate 2b transmitting a current from constant current source 2a to an internal node NB in response to activation of word line activation signal WLE. Transfer gates 1b and 2b are each constituted of an N-channel MIS transistor and has an amplitude limiting function to suppress a rise in voltage level on bit line BL and internal node NB owing to a threshold voltage loss (a source follower action). In order to make use of amplitude limiting functions of transfer gates 1b and 2b more effectively, word line activation signal WLE applied onto transfer gates 1b and 2b may be limited in amplitude.

Further, to sense amplifiers 3 and 4, there are provided: a precharge/equalize circuit 10 for precharging and equalizing a node NA to ground level according to an equalize instructing signal EQ; a transfer circuit 11 for connecting internal nodes NA and NB, respectively, to internal nodes NAA and NBB according to a select signal SL; and a precharge/equalize circuit 12 for precharging and equalizing internal nodes NAA and NBB ground voltage level according to equalize instructing signal EQ. Sense amplifiers 3 and 4 sense and amplify the changes in voltage level on internal node NAA and NBB caused by currents flowing into internal node NAA and NBB.

Precharge/equalize circuit 10 includes: an N-channel MOS transistor Q1 rendered conductive in activation of equalize instructing signal EQ to short circuit internal nodes NA and NS with each other; and an N-channel MIS transistors K2 and K3 rendered conductive in activation of equalize instructing signal EQ, to couple internal nodes NA and NB, respectively, to ground node.

Transfer circuit 11 includes: an N-channel MIS transistor K4 rendered conductive in activation of select signal SL, to couple internal node NA to internal node NAA; and an N-channel MIS transistor K5 coupling internal nodes NB and NBB electrically with each other in activation of select signal SL. Transfer circuit 11 is provided for adjusting a timing at which residual current Irmn from read current supply circuit 1 and comparison reference current Iref from reference current generating circuit 2 flow into each of sense amplifiers 3 and 4.

Precharge/equalize circuit 12 includes: an N-channel MIS transistor K6 for short circuiting internal nodes NAA and NBB in response to activation of equalize instructing signal EQ; and N-channel MIS transistors K7 and K8 rendered conductive in response to activation of equalize instructing circuit EQ to couple internal nodes NAA and NBB, respectively, to ground node.

Equalize instructing signal EQ is activated in a standby state and internal nodes NA, NAA, NB and NBB are precharged and equalized to ground voltage level in the standby state.

Sense amplifier 3 includes: a differential circuit 3a driving internal nodes NAAA1 and NBBB1 according to potentials on internal nodes NAA and NBB; an N-channel MIS transistor K11 short circuiting internal nodes NAAA1 and NBBB1 electrically in activation of equalize instructing signal EQ; a sense amplification circuit 3b activated in response to activation of sense activation signal /SEA1, to drive an internal node NAAA1 or NBBB1, which is higher in potential, to a power supply voltage level; a transfer circuit 3 rendered selectively conductive/non-conductive in response to activation of sense latch instructing signal LS1; and a transfer circuit 3c rendered selectively conductive in response to a sense latch instructing signal LS2, to couple internal nodes NAAA1 and NBBB1 to latch sense amplifier 3d when made conductive. Latch sense amplifier 3d includes cross coupled P-channel MIS transistors and cross coupled N-channel MIS transistors and, when transfer circuit 3c is in non-conductive state, is activated and confines electric charges transferred from internal nodes NAAA1 and NBBB1 and performs a sense operation to latch a result of the sense operation.

Differential circuit 3a includes: an N-channel MIS transistor K9 discharging internal node NAAA1 to ground voltage level according to a potential on internal node NAA; and an N-channel MIS transistor K10 driving internal node NBBB1 to ground voltage level according to a potential on internal node NBB. MIS transistors K9 and K10 have their respective gates coupled to internal nodes NAA and NBB and have their conductances determined according to respective potentials on internal nodes NAA and NBB, to couple internal nodes NAAA1 and NBBB1 to ground node.

MIS transistor K11, as an example, equalizes the signals (data) at a power supply voltage level and at ground level latched by latch sense amplifier 3d, and equalizes internal nodes NAAA1 and NBBB1 to an intermediate voltage level. Therefore, a circuit for precharging internal nodes NAAA1 and NBBB1 to an intermediate voltage level is not required, to reduce a current consumption and a circuit occupation area.

Alternatively, a configuration may be employed, in which a precharge transistor precharging to ground voltage level is provided in latch sense amplifier 3d and MIS transistor K11 equalizes internal nodes NAAA1 and NBBB1 to ground voltage level.

Sense amplification circuit 3b includes: P- and N-channel MIS transistors K12 and K13 with their gates and drains cross connected; and a P-channel MIS transistor K14 coupling the sources of MIS transistors K12 and K13 to power supply node in response to activation of sense activation instructing signal /SE1. With MIS transistors K12 and K13, internal node NAAA1 or NBBB1, which is at a higher potential, is raised to a power supply voltage level.

A sensing speed of sense amplification circuit 3b is determined by a current driving ability of a current source transistor K14 and in order to reliably perform a sense operation, a sensing speed is made moderate comparatively.

Sense amplifier 4 as well, similar to sense amplifier 3, includes: a differential circuit 4a driving internal nodes NAAA2 and NBBB2 according to potentials on internal nodes NAA and NBB; an N-channel MIS transistor K19 equalizing potentials on internal nodes NAAA2 and NBBB2 according to equalize instructing signal EQ; a sense amplification circuit 4b pulling up internal node NAAA2 or NBBB2, which is higher in potential, to power supply level in response to activation of sense activation instructing signal /SE2; and a transfer circuit 4c selectively coupling latch sense amplifier 4d to internal nodes NAAA2 and NBBB2 according to sense latch instructing signal LS2. Latch sense amplifier 4d is activated to perform a sense amplification operation when sense latch instructing signal LS2 is brought to L level to cause transfer circuit 4c to turn into a non-conductive state.

Components in sense amplifier 4 are the same in configuration as corresponding components of sense amplifier 3.

Differential circuit 4a includes: N-channel MIS transistors K17 and K18 driving internal nodes NAAA2 and NBBB2 to ground voltage level according to the potentials on internal nodes NAA and NBB, respectively. Sense amplification circuit 4b includes: P-channel MIS transistors K20 and K21 with their gates and drains thereof cross connected; and P-channel MIS transistor K22 coupling power supply node to the sources of MIS transistors K20 and K21 in response to activation of sense activation instructing signal /SE2.

Transfer circuit 4c includes N-channel MIS transistors K23 and K24 rendered conductive when sense latch instructing signal LS2 is at H level, to couple internal nodes NAAA2 and NBBB2 to latch sense amplifier.

With differential circuits 3a and 4a each constituted of a gate reception circuit receiving an input signal at the transistor gates, sense amplifiers 3 and 4 can perform the sensing operations according to voltages on internal nodes NAA and NBB independently of each other. Thus, sense amplifiers 3 and 4 are allowed to perform the sensing operation with sense margin different from each other.

By making different the activation timing between sense amplifiers 3 and 4, a potential difference is made different between internal nodes NAA and NBB at each start of sense operation of sense amplifiers 3 and 4. Thereby, sense margins for the signals on internal nodes NAA and NBB for sense amplifiers 3 and 4 are made different from each other to perform sense operations and thereby a shift in threshold voltage due to a change in memory cell characteristic can be detected. Output signals of sense amplifiers 3d and 4d are applied to control circuit 5 shown in FIG. 1.

In data reading, an output signal of latch sense amplifier 4d is outputted as memory cell data. This is because as detailed later, a sense operation activation timing of sense amplifier 4 is set later than that of sense amplifier 3 and the sense operation by sense amplifier 4 is performed with a sufficient sense margin, thereby enabling correct reading of memory cell data. Latch sense amplifier 3 is used for detecting a margin failure of data. Detection of a margin failure is performed on the basis of coincidence/non-coincidence between logical levels of output signals of sense amplifiers 3 and 4, which will be detailed later.

FIG. 5 is a diagram showing one example of a configuration of latch sense amplifiers 3 and 4 shown in FIG. 4. Since sense amplifiers 3 and 4 have the same configuration, a configuration of sense amplifier 3 is shown in FIG. 5 and control signals used in sense amplifiers 4 are shown in parentheses.

Sense amplifier 3 includes: N-channel MIS transistors K30 and K31 with their grates and drains cross connected; an N-channel MIS transistor K32 rendered conductive when complementary sense latch instructing signal /LS1 (/LS2) is brought to H level, to couple the sources of MIS transistors K30 and K31 to ground node; P-channel MIS transistors K33 and K34 with their gate and drains cross connected; and a P-channel MIS transistor K35 rendered conductive when sense latch instructing signal LS1 (LS2) is at L level, to couple the sources of MIS transistors K33 and K34 to power supply node.

Internal nodes NDA and NDB are coupled to internal nodes NAAA1 (NAAA2) and NBBB1(NBBB2) through transfer circuit 3c (4c). MIS transistors K30 and K31, when MIS transistor K32 is conductive, drive internal node NDA or NDB, which is lower in potential, to ground voltage level. MIS transistors K33 and K34, when MIS transistor K35 is conductive, drive internal node NDA or NDB, which is higher in potential, to power supply node and to latch.

In the configuration of sense amplifier 3 (4), there may be provided a precharge transistor precharging nodes NAAA1 and NBBB1 (NDA and NDB) to ground voltage level according to equalize instructing signal EQ.

Output signals of sense amplifiers 3(4) are generated from internal nodes NDA and NDB.

In the configuration of a data reading section shown in FIG. 4, the gate capacitances of differential circuit 3a and 4a are charged according to currents Irmn and Iref flowing through internal nodes NA and NB and the charged potentials are differentially amplified. Then, in sense amplification circuits 3b and 4b, potentials on internal nodes NAA and NBB, differentially amplified by differential circuits 3a and 4a, are further amplified. Output signals of sense amplification circuits 3b and 4b are then driven to and latched at CMOS levels by latch sense amplifiers 3d and 4d.

Since the gate capacitances of differential circuits 3a and 4a are sufficiently small, a sense operation can be performed at high speed to generate internal read data according to currents Irmn and Iref. Then, description will be given of an operation in data read section shown in FIGS. 4 and 5 with reference to a signal waveform diagram shown in FIG. 6.

In the configuration shown in FIG. 4, in memory cell MC, a current is made flowing from bit line BL to virtual source line BLS and reading is performed on data stored in a data storage region closer to virtual source line of memory cell MC.

In standby state prior to time T1, word line activation signal WLE is in inactive state and word line WL is in non-selected state. Therefore, constant current sources 1a and 2a are isolated from nodes NA and NB. Since no column select operation is performed yet, internal read data line VRDa is also isolated from bit line BL and constant current source 1a.

In the standby state, equalize instructing signal EQ is at H level, precharge/equalize circuits 10 and 12 are activated to precharge and equalize nodes NA and NAA, NB and NBB to ground voltage level. MIS transistors K11 and K19 are both in on state and internal nodes NAAA1 and NBBB1 are precharged to an intermediate voltage level or ground voltage level.

At time T1, a select operation of a memory cell is started and at first, equalize instructing signal EQ falls down to L level to complete equalize operation for internal nodes NA, NAA, NAAA1, NAAA2, NB, NBB, NBBB1 and NBBB2. Then, word line activation signal WLE is activated to raise selected word line WL to H level. A read column select gate not shown turns conductive to couple bit line BL to internal read data line VRDa, to supply a current from constant current source 1a to bit line BL through MIS transistor 1b. Virtual source line BLS is coupled to ground node.

A constant current from constant current source 1a is supplied to internal read data line VRDa and internal node NA through MIS transistor 1b, and voltage levels on node NA and bit line BL are raised according to supply currents Imem and Irmn. Similarly, a voltage level on node NB is also raised by comparison reference current Iref from constant current source 2a of reference current generating circuit 2. Comparison reference current Iref is at an intermediate level between a high threshold voltage level and a low threshold voltage level with respect to residual current Irmn.

If nodes NA and NB each have a quantity of current flowing according to stored data in memory cell MC changed and a voltage level thereof changed in response, select signal SL is raised, at time T2, to H level, and nodes NA is coupled to node NAA and node NB is coupled to node NBB.

Figure 6:
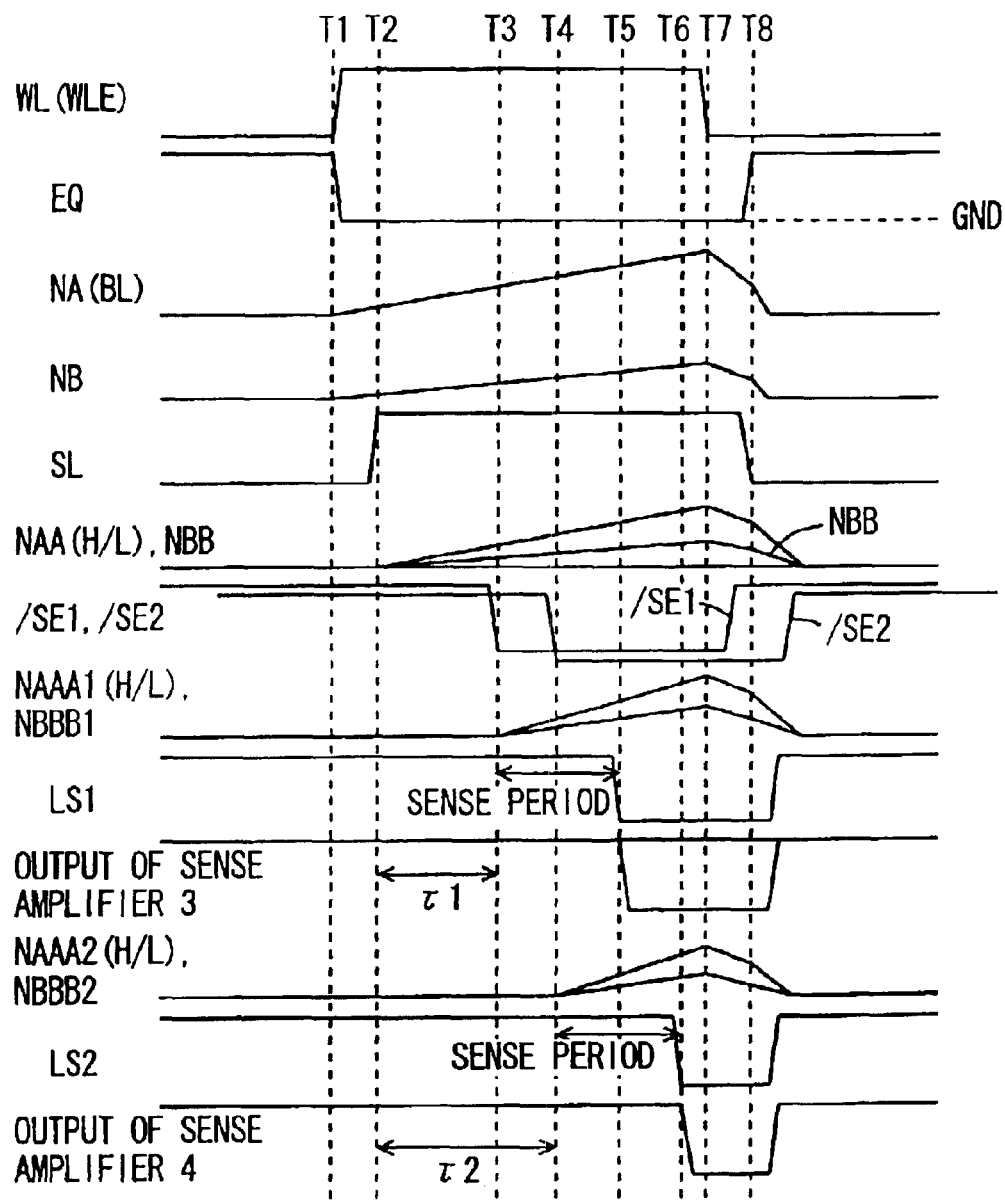
FIG. 6 is a operation signal waveform diagram representing a data read operation in the non-volatile semiconductor memory device shown in FIG. 4.

A voltage level on node NAA varies according to residual current Irmn flowing through node NB. Node NBB rises in voltage level according to comparison reference current Iref supplied from node NB. In FIG. 6, there is shown the states where residual currents Irmn in a high threshold voltage state and in a low threshold voltage state are supplied to node NAA (NAA H/L).

When voltage levels on internal nodes NAA and NBB rise, the gate capacitances of differential circuits 3a ad 4a are charged to change a conductance of the MIS transistor at the input stage. As shown in FIG. 6, if internal nodes NAAA and NBBB are precharged to ground voltage level, only conductances of MIS transistors K9, K10, K17 and K18 of differential circuits 3a and 4a become different. Internal nodes NAAA and NBBB maintain ground voltage level unchanged.

On the other hand, though not shown in FIG. 6, when the internal nodes are precharged to an intermediate voltage level, differential circuits 3a and 4a lower the potentials of internal nodes NAAA1, NBBB1, NAAA2 and NBBB2 from the intermediate voltage level according to voltage levels on nodes NAA and NBB. At that time, since in internal node NAA, a supply current is different according to stored data in memory cell MC, voltage levels on internal nodes NAAA1 ad NAAA2 each attain a high voltage state or a low voltage state according to stored data in memory cell MC with respect to internal nodes NBBB1 and NBBB2. When memory cell MC is in a low threshold voltage state, memory cell current Imem flows, and therefore a potential level on internal node NAA is lower than a potential level on internal node NBB since residual current Irmn is smaller than comparison reference current Iref. Therefore, in sense amplifier 3, for example, a potential level on internal node NAAA1 is higher than internal node NBBB1 (MIS transistor K10 has a conductance made larger and a current driving ability increased to discharge internal node NBBB1 faster than internal node NAAA1).

Then, at time T3, sense activation instructing signal /SE1 is activated to activate sense amplification circuit 3b, which in turn pulls up a potential level of internal node NBBB1 or NAAA1, whichever is higher, to power supply voltage level. In this case, a current drive ability of MIS transistor K14 is made smaller to make a pull-up speed for internal nodes NAAA1 and NBBB1 comparatively moderate.

In the sense operation, when internal nodes NAAA1 and NBBB1 are precharged to ground voltage level, currents are supplied from MIS transistors K12 and K13 in response to activation of sense amplification circuit 3b to raise potential levels of internal nodes NAAA1 and NBBB1. At this time, in differential circuit 3a, a MIS transistor having a larger conductance discharges a supplied current, while a discharge current of MIS transistor having a smaller conductance is relatively smaller. Thus, a voltage difference is produced between internal nodes NAAA1 and NBBB1 and amplified by sense amplification circuit 3a. That is, in differential circuit 3a, a potential on an internal node connected to a MIS transistor having a smaller conductance rises at a speed higher than that on the other internal node.

Then, at time T4, sense activation instructing signal /SE2 is activated to activate sense amplification circuit 4b. At time T4, internal nodes NAA and NBB have been driven for a sufficiently long period. Even if internal nodes NAAA2 and NBBB2 are maintained at precharge voltage level (ground voltage), conductances of MS transistors K17 and K18 of differential circuit 4a are sufficiently different from each other. Furthermore, even in a case where internal nodes NAAA2 and NBBB2 are precharged to an intermediate voltage, a potential difference between internal nodes NAAA2 and NBBB2 is made sufficiently large by differential circuit 4a.

Therefore, at time T4, when sense amplification circuit 4b is activated, a sense operation of potential levels of internal nodes NAAA2 and NBBB2 can be more correctly performed, compared with that by sense amplification circuit 3b.

At time T5, sense latch instructing signal LS1 is set to L level to isolate internal nodes NAAA1 and NBBB1 from latch sense amplifier 3d. At this time, electric charges corresponding to the voltage levels of internal nodes NAAA1 and NBBB1 are already stored in latch sense amplifier 3d. A sense operation is performed at high speed according to a so-called charge confinement scheme, to generate internal read data at CMOS level.

Then, at time T6, latch instructing signal LS1 is set to L level to turn transfer circuit 4c into non-conductive state to isolate latch sense amplifier 4d from internal nodes NAAA2 and NBBB2, and further to activate latch sense amplifier 4d. In sense amplification circuit 4b, during a period between time T2 and T4, differential circuit 4b is continuously driven according to voltages on internal nodes NAA and NBB. Upon activation of sense activation instructing signal /SE2 at time T4, a potential difference between internal nodes NAAA2 and NBBB2 can be correctly detected.

At time T6, latch sense amplifier 4d, when activated, amplifies a large potential difference provided through amplification by sense amplification circuit 3b at high speed to generate internal read data at CMOS level.

At time T7, reading of memory cell data is completed, word line WL is brought into non-selected state, supply of a read current to bit line BL is ceased and further supply of a current to internal node NB is also ceased. Then, at time T8, select signal SL is set to L level to isolate internal nodes NAA and NBB from internal nodes NA and NB and equalize instructing signal EQ is activated to precharge and equalize the internal nodes to ground voltage level. Furthermore, sense latch instructing signals LS1 and LS2 are driven to H level to deactivate latch sense amplifiers 3d and 4d.

In sense amplifier 3, therefore, differential circuit 3a is driven by potential levels of internal nodes NAA and NBB for a period of τ1 to accordingly drive internal nodes NAA and NBB. On the other hand, in sense amplifier 4, differential circuit 4a is driven according to voltage levels of internal nodes NAA and NBB for a period of τ2, to drive internal nodes NAAA2 and NBBB2 according to potential levels of internal nodes NAA and NBB.

In a case where internal nodes NAAA1, NBBB1, NAAA2 and NBBB2 are precharged to set potential voltage levels, there arises a difference in conductance of MIS transistors in differential circuits 3a and 4a and such difference in conductance increases with increase in potential difference between internal nodes NAA and NBB. In a case where internal nodes NAAA1, NBBB1, NAAA2 and NBBB2 are precharged to an intermediate voltage level, a potential difference between internal nodes NAAA and NBBB increases with increase in potential difference between internal nodes NAA and NBB. In any of the operating situations, therefore, a potential difference between internal nodes NAA and NBB is different for the sense amplifier 3 and for the sense amplifier 4. Accordingly, a sense margin is different according to which of sense amplification circuits 3b and 4b is operated, thereby enabling sense amplifier 4 to perform a sense operation with a sufficient margin.

On the other hand, in sense amplifier 3, changes in potential level of internal nodes NAA and NBB is small, and a sense operation is performed with a smaller margin. Change in threshold voltage characteristic of a memory cell is detected according to coincidence/non-coincidence in logical level between internal read data read by sense amplifiers 3 and 4.

In each of differential circuits 3a and 4a, the gates of MIS transistors are coupled to internal nodes NAA and NBB. Internal nodes NAA and NBB are electrically isolated from internal nodes NAAA1 and NAAA2, and NBBB1 and NBBB2 to prevent an interaction between sense operations of sense amplifiers 3 and 4 from occurring. Thereby, sense amplifiers 3 and 4 can be operated with different margins.

By activating sense amplifier 3 at a fast timing, a sense operation is performed in a state where a potential difference between nodes NAA and NBB is small. For a memory cell with a small shift in threshold voltage characteristic and a sufficient margin, data at the same logical level can be read not only in the first sense operation (sub sense), but also in the second sense operation (main sense). If a margin for a memory cell is deteriorated for some reason, a sense result by sense amplifier 3 is different from that by sense amplifier 4.

As external read data, read data of sense amplifier 4 is used. When internal read data of sense amplifier 3 is defective, it is determined that a margin failure is brought about, to change a set condition for reference current for a memory cell with the margin failure.

Here, periods (sense periods) from when sense amplification circuits 3b and 4b are activated to when the respective latch sense amplifiers 3d and 4d are activated are the same with each other, in sense amplifiers 3 and 4. That is, by making use of magnitude of a signal amplitude of a sensing object only, a sense operation is performed for the same period to detect reduction in sense margin according to a sense result.

Figure 7:
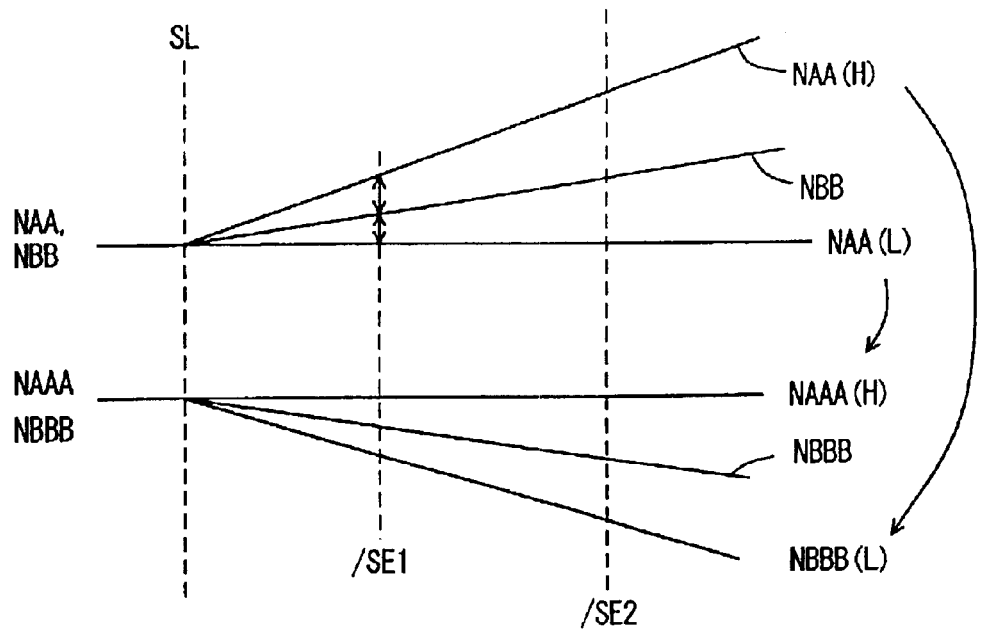
FIG. 7 is an enlarged diagram showing an example of potential changes on internal nodes of the non-volatile semiconductor memory device shown in FIG. 4.

FIG. 7 is a diagram, in an exaggerate sense, showing a change in potential of each of internal nodes NAA, NBB, NAAA (1 and 2), and NBBB (1 and 2). In FIG. 7, there is shown waveforms of changes in voltages when internal nodes NAAA and NBBB are precharged to an intermediate voltage levels.

When select signal SL is activated to cause currents to flow into internal nodes NAA and NBB, potential levels of internal nodes NAA and NBB change first. Comparison reference current Iref flows into internal node NBB, which in turn rises in potential level at a predetermined speed. A quantity of a current flowing into internal node NAA is different according to stored data in selected memory cell MC. When a threshold voltage of selected memory cell MC is low, most of a supply current from read current supply circuit flows through the memory cell, and residual current Irmn is small to cause substantially no change in voltage level of internal node NAA (NAA(L) in FIG. 7).

On the other hand, when a selected memory cell is in a high threshold voltage state, so much current does not flow or substantially no current flows through memory cell MC, and residual current Irmn becomes large in magnitude to raise a potential level of internal node NAA. (indicated by node NAA (H) in FIG. 7).

Precharge voltage (intermediate voltage level) changes with rise in potential level of internal nodes NAA and NBB. When a potential level of internal node NAA is indicated by a potential NAA(L), the potential level is at substantially ground voltage level and a corresponding MIS transistor in a differential circuit is in substantially off state. Therefore, internal node NAAA is not discharged, but maintains the intermediate level after precharge (indicated by NAAA (H) in FIG. 7).

On the other hand, when a voltage level of node NAA rises higher than node NBB, internal node NAAA is discharged at a speed higher than internal node NBBB (indicated by NBBB(L) in FIG. 7).

Since internal node NBBBB is discharged according to a change in potential of internal node NBB, a potential of internal node NBBB falls at a speed determined by the comparison reference current.

Sense amplifier 3 is activated in response to sense activation instructing signal /SE1 to cause the sense amplification circuit therein to perform a moderate sense operation according to a limited current by the sense activation transistor, to raise a potential of internal node NAAA or NBBB, whichever is higher. On the other hand, sense amplifier 4 is activated according to sense activation instructing signal /SE2, to sense a potential difference between internal nodes NAA and NBB moderately with a sense current (determined by a sense activation transistor).

A period from when sense activation instructing signal /SE1 is activated to when latch sense amplifier 3d is activated and a period when sense amplification circuit 4b is activated to when latch sense amplifier 4d is activated, that is, sense periods of sense amplifiers 3 and 4 are the same. By setting sense periods to be the same, potential differences of interest are made different, and thus, it is determined whether a sense margin failure arises on the basis of whether or not sense amplifier 3 malfunctions.

Figure 8:
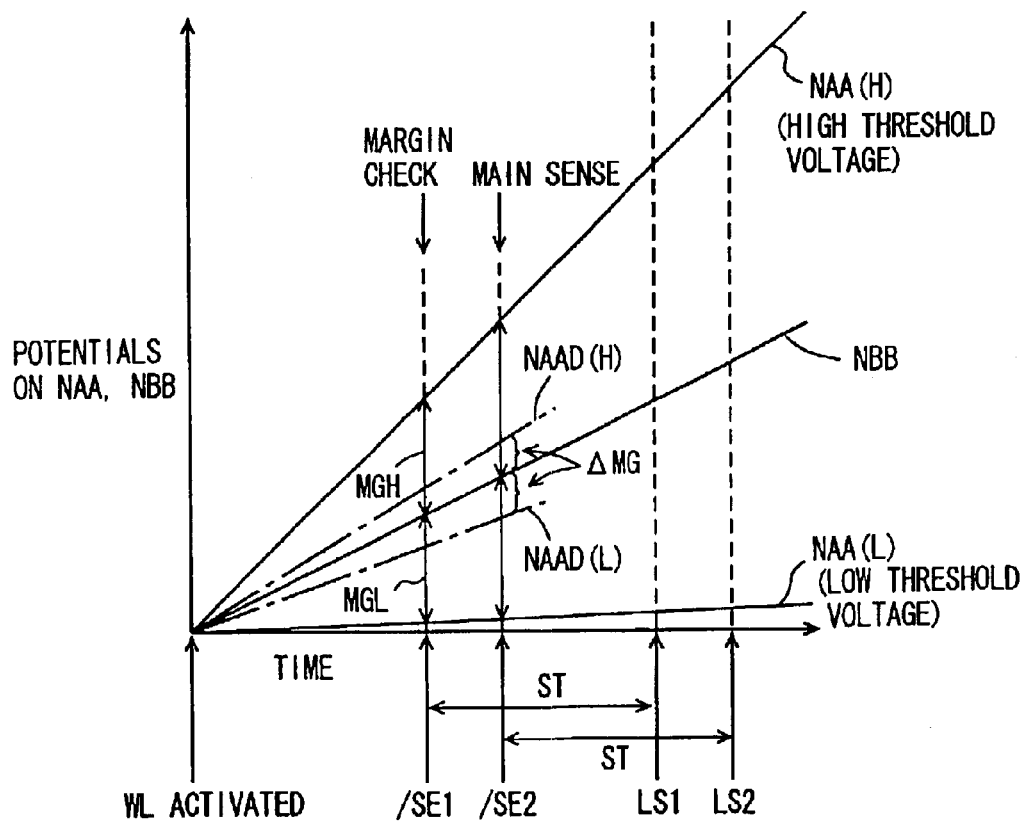
FIG. 8 is a diagram showing a relationship between potentials on internal nodes and a timing in a sense operation.

FIG. 8 is a diagram showing margin check according to a dual sense scheme using sense amplifiers 3 and 4. In FIG. 8, the abscissa indicates time, and the ordinate indicates potentials on nodes NAA and NBB.

Word line WL is selected and residual current Irmn flows into node NAA according to stored data in a selected memory. In a case where a threshold voltage of the selected memory cell is low, memory cell current Imem flows through the selected memory cell and residual current Irmn is small in magnitude to slow a charging speed of node NAA. That is, a change in potential on node NAA in a state where a threshold voltage of the selected memory cell is low, is represented by a straight line NAA(L).

When a selected memory cell has a high threshold voltage, a current Imem flowing through the selected memory cell is very small, while residual current Irmn becomes large, thereby increasing a charging speed of node NAA. On the other hand, node NBB is charged by comparison reference current Iref, and has a charging speed constant.

Sense amplifiers 3 and 4 senses and amplify a potential difference between nodes NAA and NBB. When activated in response to activation of sense amplification instructing signal /SE1, sense amplifier 3 senses a potential difference between nodes NAA and NBB. At this time, a potential difference between nodes NAA and NBB corresponding to a memory cell in a high threshold voltage state, or a sense margin MGH, is still small and a potential difference between nodes NAA (NAA(L)) and NBB corresponding to a memory cell in a low threshold voltage state, or a margin MGL for a low threshold voltage state is still small. That is, sense amplifier 3 performs a sense operation under a state where a sense margin is small. Therefore, a margin upon reading data in selected memory cell 2 is checked.

Sense amplifier 4 is activated in response to activation of sense activation instructing signal /SE2, later than sense amplifier 3, and senses and amplifies a potential difference between nodes NAA and NBB. When sense amplifier 4 is activated, a potential difference between nodes NAA and NBB is sufficiently large with a sufficient margin, and a correct sense operation is performed to generate internal read data corresponding to a threshold voltage state of a memory cell.

Sense amplifiers 3 and 4 have the same sense period ST and perform the last sense operations (high speed response) with latch sense amplifiers in response to sense latch instructing signals LS1 and LS2, respectively. Therefore, in a case where sense amplifiers 3 and 4 have the same sense period ST but have different margins for input signals, if an error would occur, such error would occur first in sense amplifier 3. Whether or not a margin failure arises is identified by detection of coincidence/non-coincidence in logical level between internal read data read by sense amplifiers 3 and 4.

As shown in FIG. 8, when a sense operation is performed by sense amplifier 4 in response to activation of sense activation instructing signal /SE2, sense margins on the H level side and on the low level side are assumed being ΔMG. A potential on node NAA in a state of a threshold voltage failure is indicated by a straight line NAAD(H) and a potential on node NAA when an abnormal cell in a low threshold voltage state is selected is indicated by a straight line NAAD(L). In a situation where a threshold voltage failure occurs, sense amplifier 4 can perform a correct sense operation if a potential difference between nodes NAA and NBB is equal to or greater than the minimum sense margin ΔMG when sense amplifier 4 is activated by sense activation instructing signal /SE2. Sense amplifiers 3 and 4 have the same configuration and the same sense period. In this state, as a sense margin for sense amplifier 3, there is caused only a potential difference smaller than the minimum sense margin ΔMG, leading to a high possibility of malfunction of sense amplifier 3. Therefore, it is determined that a margin failure occurs if non-coincidence arises in logical level between internal read data generated from sense amplifiers 3 and 4 and a current level of comparison reference current Iref is adjusted.

FIG. 9 is a table showing, in a list form, contents of processing performed on the basis of output signals of sense amplifiers 3 and 4. Determination processing shown in FIG. 9 is performed in control circuit 5 shown in FIG. 1.

In FIG. 9, a result of a sub sense operation shows output data of sense amplifier 3 and a result of a main sense operation shows an output data of sense amplifier 4.

When output signals of sense amplifiers 3 and 4 show both high threshold voltage states, logical levels of output data of respective sense amplifiers 3 and 4 are in coincidence with each other and correct sense operations are operated wherein margins are normal (OK). In this case, since a selected memory cell is in a normal threshold voltage state, no specific processing is performed.

On the other hand, in a case where an output signal of sense amplifier 3 indicates a low threshold voltage state while an output of sense amplifier 4 indicates a high threshold voltage state, logical levels of output data of sense amplifiers 3 and 4 are non-coincident. Accordingly, a margin failure (NG) occurs in a margin check operation (a sub sense operation) by sense amplifier 3 and it is determined that a threshold voltage characteristic changes and that a threshold voltage of a memory cell in a high threshold voltage state decreases.

That is, although a selected memory cell should be in off state (a read voltage is set at an intermediate voltage level between a high threshold voltage and a low threshold voltage), memory cell current Imem flows and a residual current Irmn flowing into sense amplifiers 3 and 4 decreases. Therefore, in this case, comparison reference current Iref is adapted to be reduced. Thereby, for a memory cell that is set to a high threshold voltage and has a characteristic deteriorated to be apt to cause a leakage current, comparison reference current Iref is reduced to secure a sense margin.

In a case where output data of sense amplifiers 3 and 4 both indicates low threshold voltage states, logical levels of output data of sense amplifiers 3 and 4 are coincident with each other and a margin is normal (OK), leading to no specific operation.

On the other hand, if output data of sense amplifier 3 indicates a high threshold voltage state, while output data of sense amplifier 4 indicates a low threshold voltage state, logical levels of output data of sense amplifiers 3 and 4 are non-coincident with each other and it is determined that a margin failure (NG) occurs. In this state, a threshold voltage of a memory cell set to a low threshold voltage state shifts toward a higher level. That is, a memory cell is in a low threshold voltage state, discharge is not performed sufficiently though more memory cell current should be discharged through a memory cell, and the quantity of current flowing into sense amplifiers 3 and 4 increases. Therefore, in this case, comparison reference current Iref supplied from the comparison reference side is increased to compensate for a rise in threshold voltage of the memory cell.

By performing adjustment in comparison reference current Iref according to a situation of each individual memory cell, a sense operation can be performed with a sufficient margin secured for each memory cell.

Figure 10:
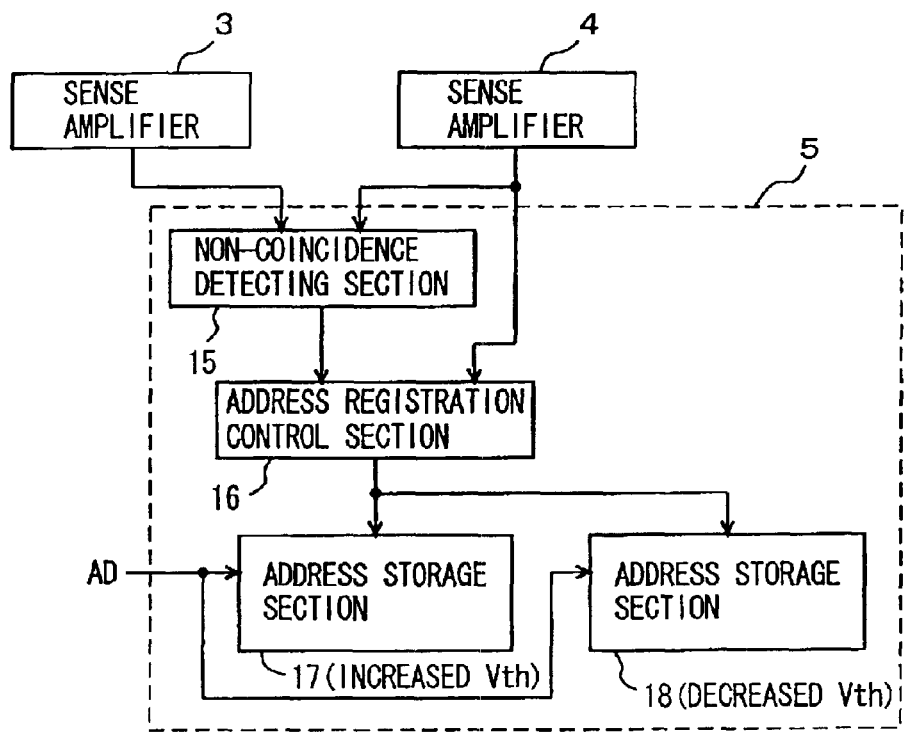
FIG. 10 is a diagram functionally illustrating a configuration of a part related to address registration in a control circuit 5 of the first embodiment of the present invention.

FIG. 10 is a diagram schematically showing a configuration of an address registration control section for a memory cell with a deteriorated characteristic, included in the control circuit 5 shown in FIG. 1. In FIG. 10, control circuit 5 includes: a non-coincidence detecting section 15 receiving output signals of sense amplifiers 3 and 4 to detect coincidence/non-coincidence between logical levels of output data of sense amplifiers 3 and 4; an address registration control section 12 for controlling registration of an address of a memory cell according to a non-coincidence detection indicating signal from non-coincidence detecting section 15 and output data of sense amplifier 4; and address storage sections 17 and 18 storing an address signal AD under control of the address registration control section 16. Address storage section 17 stores the address of a memory cell address having a risen threshold voltage, and address storage section 18 stores the address of a memory cell having a fallen threshold voltage.

Control circuit 5 is generally constituted of a processor and the like and its operation is controlled in a software manner, and in FIG. 10, there is shown a configuration associated with address registration and control of control circuit 5 functionally.

Address storage sections 17 and 18 each are configured of, for example, electric fuses (fusible electrically, for example, a fuse ROM), an electrically programmable, erasable non-volatile read-only memory or an SRAM (static random access memory). In address storage sections 17 and 18, even if address programming is performed using an electric fuse, a characteristic of a memory cell changes with increase in the number of times of rewriting (erasure/programming), but since the direction of the change is constant, no problem arises. For example, in a case where a threshold voltage characteristic changes to shift a threshold voltage to a higher level, the threshold voltage shifts to a higher level even when rewriting is performed after a margin failure occurs. Therefore, a sufficient margin can be secured in rewriting, by adjusting the reference current in detection of a margin failure.

Figure 11:
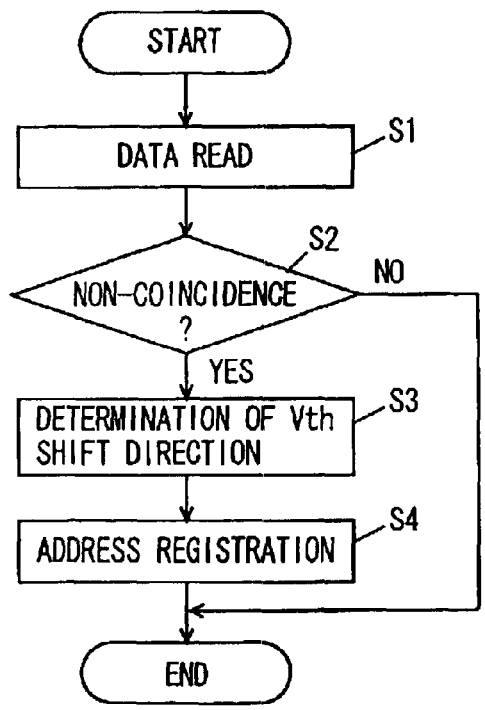
FIG. 11 is a flowchart showing an address registration operation in the control circuit shown in FIG. 10.

FIG. 11 is a flowchart representing an address registration operation in control circuit 5 shown in FIG. 10. Referring to FIG. 11, description will be given of an operation in control circuit 5 shown in FIG. 10.

First, data is read from a selected memory cell (step S1). The data reading includes a read operation on a memory cell for performing verification of erased/written states when erasure/writing are performed internally.

Data reading is performed and it is determined whether logical levels of output data of sense amplifiers 3 and 4 are non-coincident in non-coincidence detecting section 15 (step S2). Since no problem arises in a case where logical levels of output data of sense amplifiers 3 and 4 are coincident, no address registration is performed.

On the other hand, when in step S2, it is determined that logical levels of output data of sense amplifiers 3 and 4 are non-coincident, then address registration control section 16 determines a shifting direction of a threshold voltage (Vth), using the output data of sense amplifier 4 (step S3).

Address registration of a memory cell is performed under control of address registration control section 16 according to determination on whether a threshold voltage (Vth) increases or decreases (step S4). An address AD indicates a unit region in switching a current quantity of reference current Iref. Address AD may be an address signal of each memory cell, an address signal for each memory block, an address signal for each sector (or a word line) of an erasure unit, or a column address signal designating a memory cell column unit. A registration address is appropriately determined according to a scale of address registration sections 17 and 18 and a configuration and scale of a circuit section detecting address coincidence as described later. As the minimum unit, a reference current is changed for each a sector (word line) of an erase unit, or in units of columns. In this case, for a programmed (registered) address, there is employed a word line address signal specifying a word line or a column address specifying a memory cell column (bit line). The column address designates a pair of bit lines because of a configuration of a memory array using a virtual source line.

Figure 12:
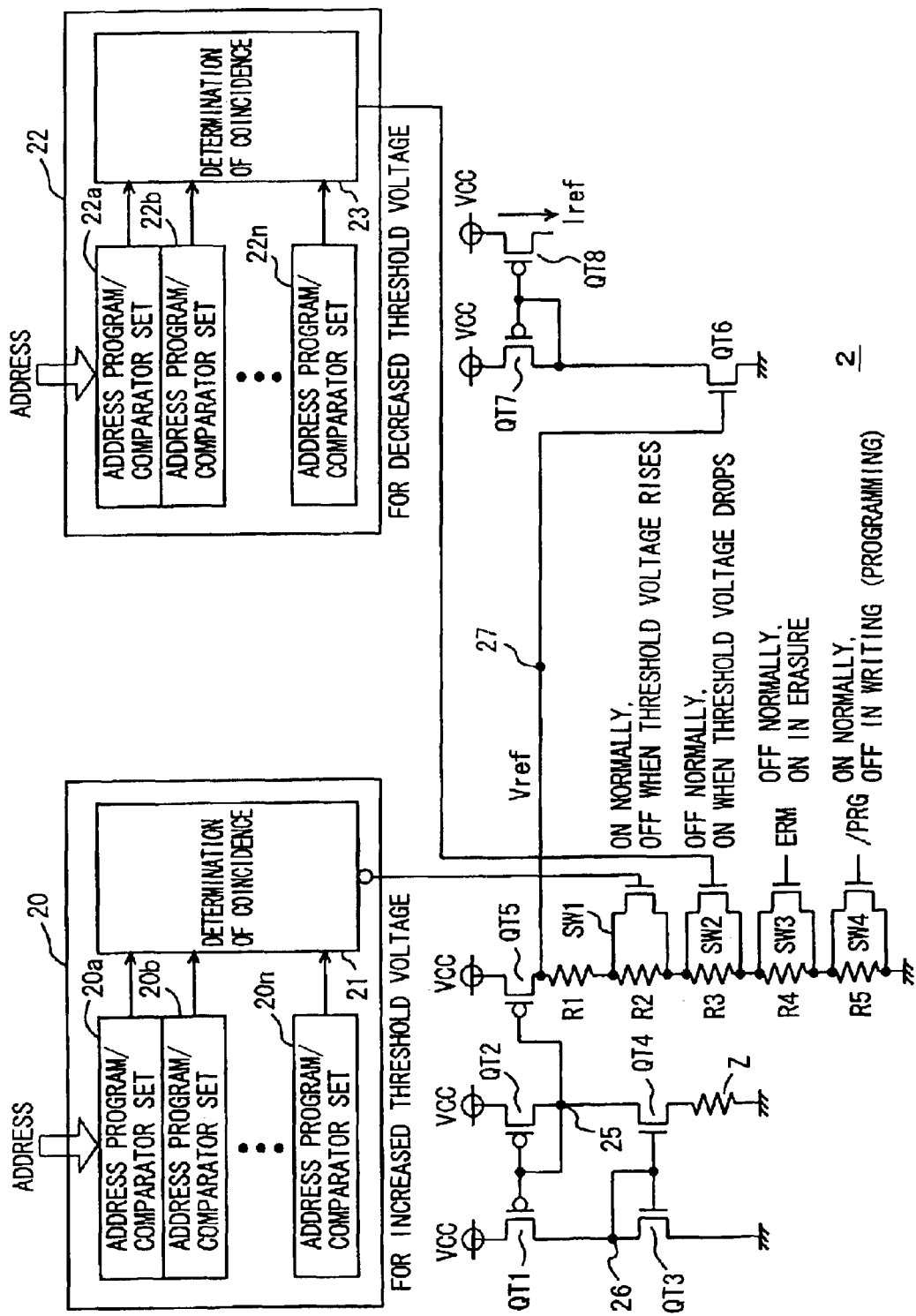
FIG. 12 is a diagram schematically showing a configuration of a reference current generating circuit and a reference current adjusting section in the first embodiment of the present invention.

FIG. 12 is a diagram showing one example of a configuration of a reference current adjusting section included in each of reference current generating circuit 2 and control circuit 5 shown in FIG. 1. In FIG. 12, control circuit 5 includes: a reference current adjusting section 20 for accommodating for a rise in threshold voltage of a memory cell; and a reference current adjusting section 22 for accommodating for a drop in threshold voltage. Reference current adjusting sections 20 and 22 each store the address of a memory cell having a margin failure produced by a shift in threshold voltage, and determine whether or not an applied address (including a verify address and an external read address) designates a programmed (registered) address to selectively adjust a magnitude of reference current Iref supplied by reference current generating circuit 2 according to a result of the determination.

Reference current adjusting section 20 includes: address program/comparator sets 20a to 20n each for programming an address of each adjustment unit and comparing an applied address and a programmed address; and coincidence determining circuit 21 determining whether the applied address signal designates the programmed address according to outputs of address program/comparator sets 20a to 20n.

Address program circuits included in address program/comparator sets 20a to 20n correspond to address storage section 17 shown in FIG. 10.

Reference current adjusting circuit 22 similarly includes: address program/comparator sets 22a to 22n; and coincidence determining circuit 23 determining whether the applied address signal designates the programmed address according to outputs of address program/comparator sets 22a to 22n. Address program circuits included in address program/comparator sets 22a to 22n correspond to address storage section 18 shown in FIG. 10.

An address program circuit included in each of reference current generating circuits 20 and 22 is configured of electric fuses, an electrically programmable/erasable non-volatile read-only memory or an SRAM in similar manner to the configurations of address storage sections 17 and 18 shown in FIG. 10.

Reference current generating circuit 2 includes: a constant current generating section generating a constant current; a reference voltage generating section converting the constant current to a voltage to generate reference voltage Vref; and a reference current supply section generating reference current Iref according to reference voltage Vref. The reference voltage generating section has a function of changing a voltage level of reference voltage Vref.

The constant current generating section includes: a P-channel MIS transistor QT1 connected between power supply node and a node 26, and having a gate connected to a node 25; a P-channel MIS transistor QT2 connected between power supply node and node 25, and having a gate connected to a node 25; an N-channel MIS transistor QT3 connected between node 26 and ground node, and having a gate connected to node 26; and an N-channel MIS transistor QT4 and a high resistance element Z, connected in series between node 25 and ground node.

The gate of MIS transistor QT4 is connected to node 26. A current driving ability (a size: ratio of a channel width to channel length) of MIS transistor QT4 is set so as to be sufficiently larger than that of MIS transistor QT3.

The constant current generating section further includes a P-channel MIS transistor QT5 connected between power supply node and a node 27, and having a gate connected to node 25.

In the constant current generating section, MIS transistors QT1 and QT2 constitute a current mirror circuit, and supply currents of the same magnitude. Since currents of the same magnitude flow in MIS transistors QT3 and QT4, gate to source voltages Vgs of MIS transistors QT3 and QT4 are different from each other. That is, a source potential of MIS transistor QT4 becomes higher than ground voltage level and a difference in gate to source voltage between MIS transistors QT4 and QT3 is applied across high resistance element Z.

When a potential level of node 26 rises, a quantity of current flowing through MIS transistor QT4 increases. In response, a voltage drop across high resistance element Z is increased to raise a source potential of MIS transistor QT4 to decrease a quantity of current flowing through MIS transistor QT4. In response to the decrease, a supply current into node 26 is reduced through a feed-back loop of MIS transistors QT2 and QT1 to lower a potential level of node 26. In contrast, when a potential level of node 26 lowers, a driving current of MIS transistor QT4 decreases to reduce a voltage drop across high resistance element Z. Therefore, a gate to source voltage of MIS transistor QT4 rises to increase a current flowing through MIS transistors QT2 and QT1 and to raise a potential level of node 26. Therefore, a difference in gate to source voltage between MIS transistors QT4 and QT3 always stays constant to cause a constant current, determined by a difference in gate to source voltage between MIS transistors QT4 and QT3 and a resistance value of high resistance element Z, to flow through MIS transistor QT2.

MIS transistor QT5 constitutes a current mirror circuit together with MIS transistor QT2 to supply a current of a prescribed magnitude.

The reference voltage generating section includes: resistance elements R1 to R5 connected in series between node 27 and ground node; switching transistors SW1 to SW4 connected in parallel to the respective resistance elements R2 to R5. By selectively setting switching transistors SW1 to SW4 into conductive or non-conductive state, a combined resistance connected between node 27 and ground node is changed to adjust a voltage level of reference voltage Vref.

An output signal of coincidence determining circuit 21 is applied to the gate of switching transistor SW1 and an output signal of coincidence determining circuit 23 is applied to the gate of switching transistor SW2. An erase operation mode instructing signal ERM is applied to switching transistor SW3 and a write mode instructing signal (program mode instructing signal) /PRG is applied to switching transistor SW4. Switching transistors SW1 to SW4 each is constituted of an N-channel MIS transistor and short circuits a corresponding resistance element when conductive, to reduce a resistance value of the combined resistance between node 27 and ground node.

Switching transistor SW1 is set into conductive state in a normal operation, and set into non-conductive state when a threshold voltage rises according to an output signal of coincidence determining circuit 21. Switching transistor SW2 is set into non-conductive state when a normal memory cell is selected, and set into conductive state when a threshold voltage drops according to an output signal of coincidence determining circuit 23. Switching transistor SW3 is set into off state in a normal operation mode, and set into conductive state in erase operation mode according to erase operation mode instructing signal ERM. Switching transistor SW4 is set into conductive state in a normal operation mode and set into non-conductive state in program operation in which data is written, according to a program mode instructing signal /PRG.

The reference current supply section includes: an N-channel MIS transistor QT6 receiving reference voltage Vref at a gate thereof, a P-channel MIS transistor QT7 connected between power supply node and MIS transistor QT6, and having a gate and drain connected together; and a P-channel MIS transistor QT8 connected between power supply node and output node, and having a gate coupled to the drain node of MIS transistor QT7.

In the reference current supply section, a quantity of drive current of MIS transistor QT6 is set according to reference voltage Vref. A current is supplied to MIS transistor QT6 from MIS transistor QT7. MIS transistors QT7 and QT8 constitute a current mirror circuit and a mirror current of a current flowing MIS transistors QT7 and QT6 is outputted from MIS transistor QT8 as reference current Iref. Therefore, by adjusting a voltage level of reference voltage level Vref in the reference voltage generating section, a quantity of a current flowing through MIS transistors QT6 and QT7 can be adjusted, thereby enabling adjustment in current quantity of reference current Iref.

To be specific, by setting switching transistor SW1 into off state when a threshold voltage rises, a resistance component of resistance element R2 is added to raise a voltage level of reference voltage Vref, to increase a current quantity of reference current Iref. When a threshold voltage lowers, by setting switching transistor SW2 into an on state, resistance element R3 is short circuited, to lower a voltage level of reference voltage Vref, to reduce a current quantity of reference current Iref.

Figure 13:
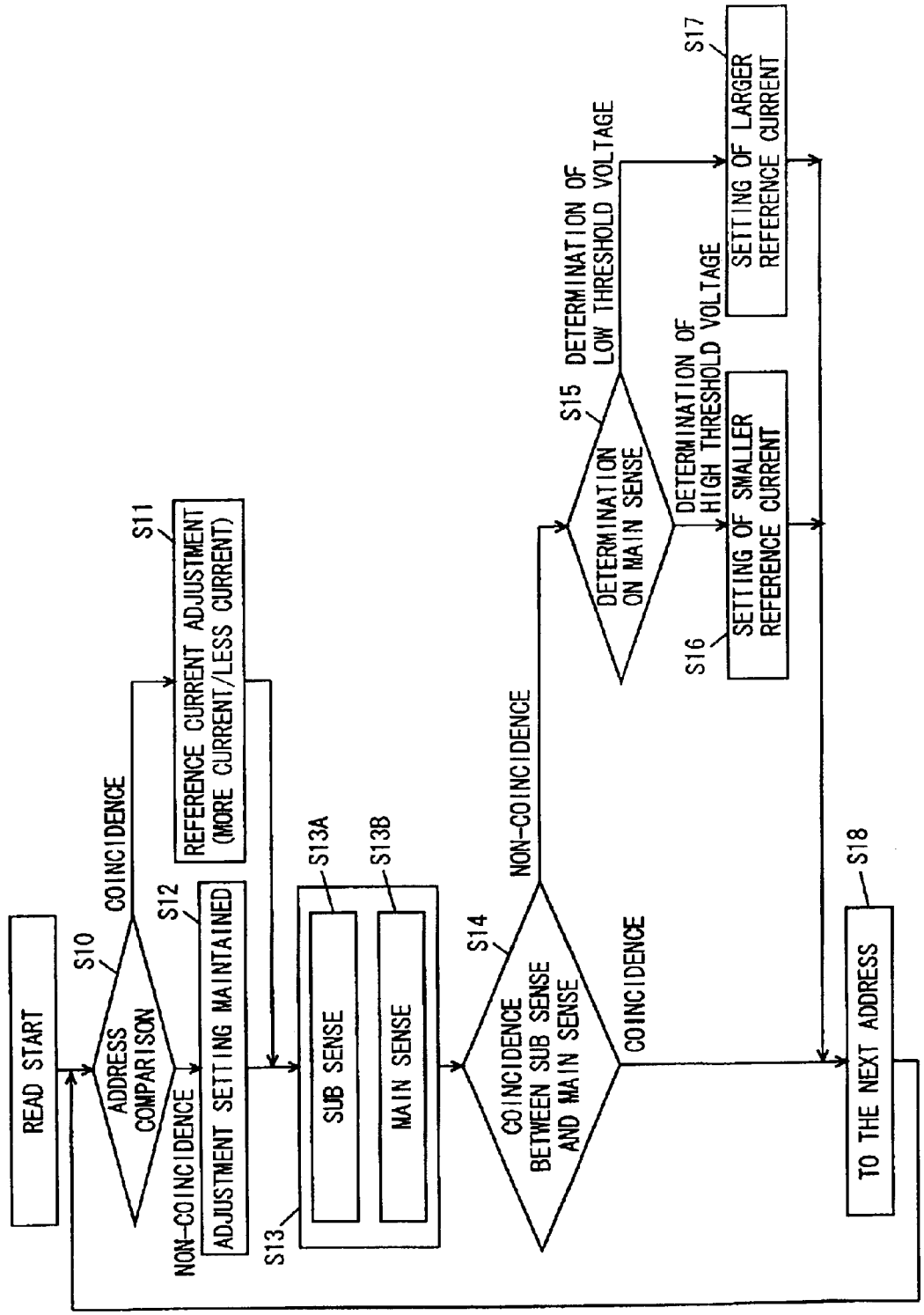
FIG. 13 is a flowchart showing an operation in data reading of the non-volatile semiconductor memory device in the first embodiment of the present invention.

FIG. 13 is a flowchart representing an operation in data reading of reference current generating circuit 2 and control circuit 5 shown in FIG. 12. The data reading is an external read operation of data and does not include data reading for erasure verification and data reading for program verification. In erase/write verify operation, adjustment in reference current is performed on only a memory cell causing a verify defect a prescribed number of times, as described later. With reference to FIG. 13, description will be given of a control operation in control circuit 5 shown in FIG. 12 below.

At the start of reading, a generated memory cell address is applied to reference current generating sections 20 and 22 of control circuit 5 and is compared with programmed addresses therein (step S10). The memory cell address is compared in parallel with addresses programmed in address program/comparator sets 20a to 20n and 22a to 22n, and output signals indicating results of determination are generated from coincidence determining circuits 21 and 23.

When coincidence is indicated in each of coincidence determining circuits 21 and 23, switching transistors SW1 and SW2 in reference current generating circuit 2 are set to conductive/non-conductive state according to output signals of coincidence determining circuits 21 and 23 to adjust a current level of reference current Iref (step S11). On the other hand, in step S10, when the applied address is not programmed in reference current adjusting sections 20 and 22, output signals of coincidence determining circuits 21 and 23 indicate no-coincidence, and setting of adjustment in reference current Iref is not changed.

If the data reading is a normal external reading operation of data, switching transistor SW3 is set into an off state, while switching transistor SW4 is set into an on state.

After setting of reference current in steps S11 and S12, selection of a memory cell and reading data are performed (step S13). In data read operation, a sub sense operation by sense amplifier 3 (step S13A) and a main sense operation by sense amplifier 4 (step S13B) are performed.

Then, it is determined whether a sub sense result and a main sense result are coincident or non-coincident (step S14). When the sub sense result and the main sense result are non-coincident, a determination on a logical level of the main sense result is made by sense amplifier 4 (step S15). When the main sense result indicates a high threshold state, it means that the threshold voltage of the memory cell is lowered due to deterioration in characteristic and the reference current is lowered for this address (step S16). In step S16, a memory cell address is registered in reference current adjusting section 22.

On the other hand, in a case where, in step S15, the main sense result indicates a low threshold voltage state, a current of the memory cell becomes hard to flow due to deterioration in characteristic of the memory cell due to rise in threshold voltage. Therefore, a processing of increasing the reference current is performed (step S17). That is, in step S17, the address of the memory cell is programmed in reference current adjusting section 20.

In data reading, when a margin failure is further detected at a registered address, a prescribed error processing is performed. In FIG. 12, there is shown a configuration in which a quantity of reference current is adjusted according to output signals of coincidence detecting circuits 21 and 23, and the address of a memory cell causing a margin failure once is not re-registered.

Alternatively, in an address programming (registration) in steps S16 and S17, the following procedure may be adopted in a case where an address is registered already and a reference current is adjusted for the registered address. That is, in address registration, an address and the number of detected margin failures are stored. When the number of times of margin failures does not reach the maximum allowable number, the number of detected margin failures of the registered address is incremented by one and a quantity of reference current is adjusted according to a number of detected margin failures. Therefore, each time the number of times of margin failures is incremented by one, the reference current is changed by a unit step.

In a configuration of changing the reference current by the unit step at a time as described above, information on the number of times of corresponding detected margin failures is read out when a registered address is designated, to adjust the reference current according to information on the number of times of failures. Therefore, in the configuration shown in FIG. 12, the number of switching transistors SW1 and SW2 is increased and correspondingly, the number of resistance elements is increased. The number of switching transistors SW1 and SW2 set to conductive state is increased/decreased according to the number of times of detection of margin failures.

For a configuration for reading information on the number of times of detection of margin failures, information on the number of detected margin failures is read out from each address program circuit. Selection is made on the read out information according to an output signal of a corresponding comparison circuit, and a selected information on the number of times of detection of margin failures is decoded to generate a signal controlling conduction of a switching transistor in the reference voltage generating circuit.

In step S14, when a sub sense result and a main sense result are coincident with each other, it is determined that a sufficient margin is provided and a state of the reference current is maintained intact.

In erase/write operation, as detailed later, a target value of a threshold value is set to a prescribed value to perform erasure/writing regardless of deterioration in characteristic of a memory cell or others. Only in verify operation, setting of the reference current is selectively performed according to pass/fail of a margin. As a defective memory cell in verify operation, a memory cell is detected as a defective cell for which a sufficient margin can not be secured even if a prescribed number of times of erasures or writings is repeatedly performed. The address of the defective memory cell is registered to change the reference current (if the defective memory cell has been registered, according to the result of registration) and perform verify operation. Therefore, in verify operation within a prescribed number of times of verify operations or less, verify operation is performed simply according to a main sense result. Reference current Iref is set so as to reduce a margin and a correct verify operation can be performed.

FIG. 14 is a flowchart representing an erase operation. In erase operation, electrons are extracted from a charge accumulating region (insulating film) to lower a threshold voltage. With reference to FIG. 14, description will be given of an adjusting operation for the reference current in erase operation mode below.

When erase operation mode is designated, an erase program is started. First, necessary conditions for erase operation are set (step S20). In erase mode, a threshold voltage of a memory cell transistor is set low. In order to perform verify operation with the reference current Iref to the sense amplifiers reduce, switching transistor SW3 in the reference current generating circuit shown in FIG. 12 is set to on state to lower the reference voltage Vref to reduce the reference current Iref. In erase mode, the current quantity of comparison reference current Iref for an address stored in reference current adjusting sections 20 and 22 is not performed. That is, adjustment of the reference current by address comparison is performed only in the last verify sequence detailed later but not performed in a normal verify operation.

To be specific, in erase verify operation in which internal reading of data is performed, switching transistors SW3 and SW4 are both set to an on state. In write verify operation, switching transistors SW3 and SW4 are set to an off state. Therefore, in erase verify operation, switching transistors SW3 and SW4 both enter on state, a voltage level of reference voltage Vref lowers to decrease the reference current Iref. On the other hand, in write verify operation in which internal reading of data is performed in a similar manner, switching transistors SW3 and SW4 are set to an off state. A voltage level of reference voltage Vref is raised to raise a voltage level of reference current Iref.

Since a memory cell in erased state flows a larger current, residual current Irmn is small, and reference current Iref is made small to decrease a sense margin in erase verify operation for performing the verify operation. In a memory cell in a written state, since substantially no current flows, residual current Irmn becomes large, and reference current Iref is made larger to decrease a sense margin.

By performing verify operation under the state of a small sense margin, correct verify operation is achieved. A sense margin can be increased in data reading in a normal operation mode.

When erase setting is completed, then an erase sequence is performed (step S21). In the erase sequence, there is performed erasure on a memory cell of an erase target. That is, a negative voltage pulse is applied to the control gate electrode of a memory cell transistor and a positive voltage pulse is applied to the drain (bit line) thereof. With the positive voltage applied to the drain, hot holes are generated and accelerated by the voltage of the control gate to be injected into an insulating film and to cause accumulated electrons therein to be annihilated through recombination. Thereby, a threshold voltage of the memory cell transistor is lowered.

When the erase sequence is completed, then there is performed an erase verify operation to determine whether or not erasure has been correctly performed (step S22). In the verify operation, an erase verify voltage is applied onto a word line of an erase target. In the erase verify operation, a current amount of reference current Iref is reduced in step S20 of erase setting step. In the erase state, the threshold voltage is lowered. In such low threshold voltage state, a state likely to cause a margin failure is the state in which the threshold voltage is shifted to a higher level. In a case of a threshold voltage rising defect, residual current Irmn increases more than in a normal memory cell. In such a state, by decreasing reference current Iref, a small margin is set for a risen threshold voltage to detect an erasure failure due to a threshold voltage rising defect with certainty.

In the verify operation, a memory cell is selected and a current is caused to flow in the memory cell and determination is made on whether or not a current with a desired magnitude flows through the memory cell (step S23). In step S23, for a verify operation, if a memory cell is correctly set in an erased state, erasure is performed on a memory cell at the next address (step S24). If a current address is the last address, the erase operation is terminated since a next address is not present. If the next address is not the last address of addresses of erasure target, the process returns again to step S21 to perform an erase operation by injection of hot holes.

On the other hand, in step S23, if it is determined that a verify result is defective (NG), that is, if in step S23, a main sense result does not indicate the erased state, it is determined whether or not the number of times of verify operations reaches a predetermined count (step S26). If the number of times of verify operations does not reach the prescribed count, the process returns again to step S21 to perform erasure on the same memory cell.

In step S26, if it is determined that the number of times of verify operations reaches the prescribed count, the last verify setting is performed in order to perform the last verify operation (step S27). In step S27 of the last verify setting, reduction in a voltage level of reference current Iref is cancelled, switching transistor SW3 shown in FIG. 12 is set to a non-conductive state and a quantity of reference current Iref is increased. In this state, last verify sequence EVQ is performed.

Figure 15:
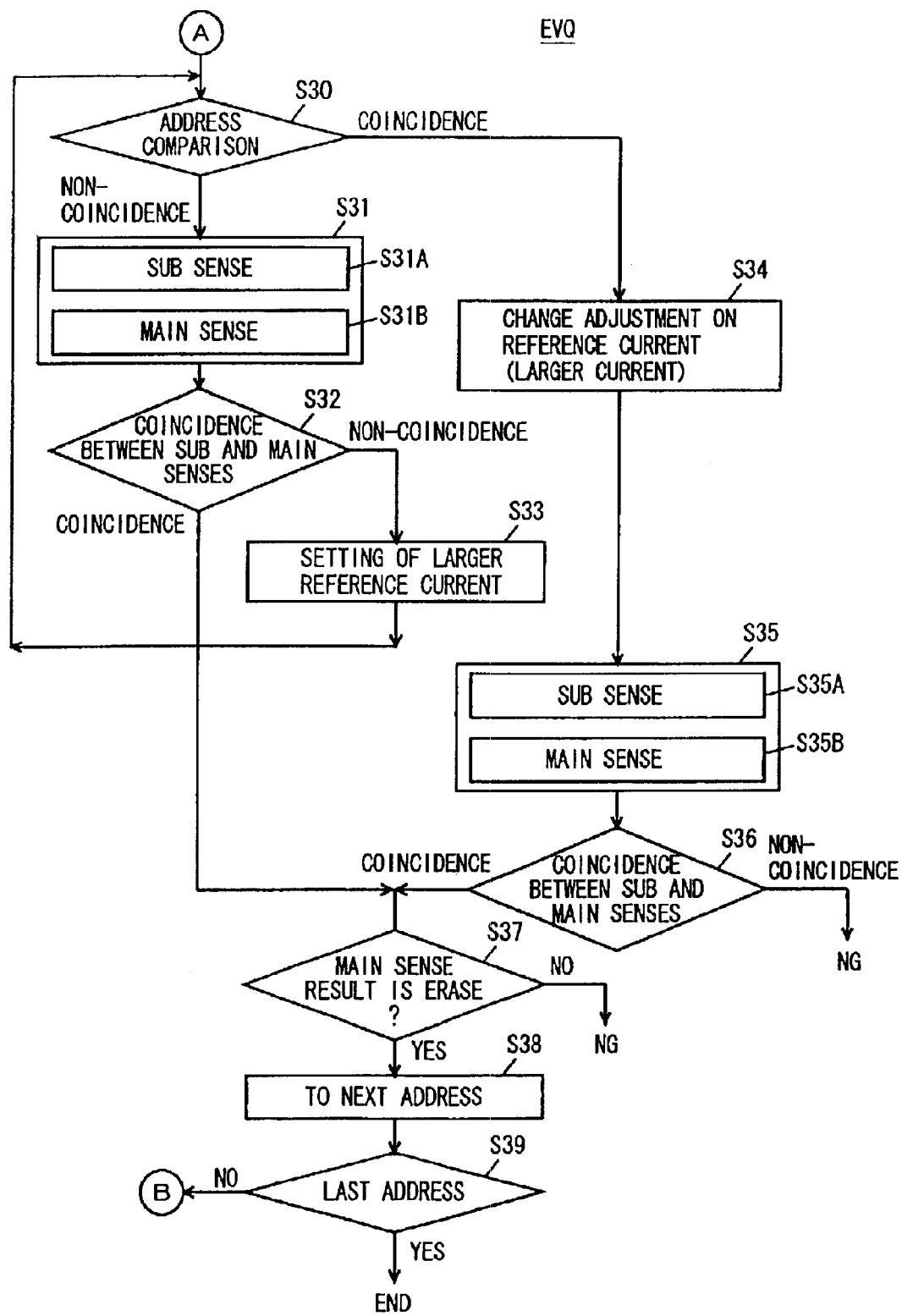
FIG. 15 is a flowchart showing contents of an operation in the last verify sequence shown in FIG. 14.

FIG. 15 is a flowchart representing process steps in the last verify sequence shown in FIG. 14. Referring to FIG. 15, description will be given of the contents of last verify sequence EVQ below.

In the last verify sequence EVQ, it is first determined whether or not registration of a memory cell address is made in reference current adjusting section 20 shown in FIG. 12. An erase operation is an operation of lowering a threshold voltage and in this case, where to produce a margin failure is a memory cell failure causing a rise in threshold voltage. Therefore, it is detected whether or not an address is registered at reference current adjusting section 20 for accommodating for such rise in threshold voltage (step S30).

In step S30, when an address is registered and a memory cell of interest is recognized to be of a small margin (a memory cell a threshold voltage of which cannot be made sufficiently small), reference current Iref is then adjusted to be increased (step S34).

In last verify sequence EVQ, in the reference current generating circuit shown in FIG. 12, switching transistor SW3 is in an off state, switching transistor SW2 is in an off state and switching transistor SW4 is in an on state. In this state, in address registration, switching transistor SW1 is set into an off state to increase reference current Iref. Under this state, reading of data from the memory cell is again performed (step S35).

In step S35, a sub sense operation in step S35A and a main sense operation in step S35B are performed. Thereafter, it is detected whether a sub sense result coincides with a main sense result (step S36). In step S36, if the sub sense result and the main sense result are still in non-coincidence with each other, the memory cell is determined defective (NG) as a margin failure cannot be resolved and a necessary error processing is performed.

On the other hand, in step S30, if an address is not registered, the memory cell is determined to be one not causing a margin failure yet and reading of memory cell data is performed (step S31). In step S31 as well, there are performed a sub sense operation in step S31A and a main sense operation in step S31B.

Then, it is determined whether or not a sub sense result and a main sense result are in coincidence/non-coincidence with each other (step S32). In step S32, if it is determined non-coincident, the unregistered address is registered at reference current adjusting section 20 (step S33). After the operation in step S33, the process returns again to step S30.

When comparison is again performed on the addresses in step S30, the address of the memory cell is registered at reference current adjusting section 20 and a result of the address comparison indicates coincidence. Therefore, reference current adjustment is performed to increase the reference current for increasing the margin.

In steps S32 and S36, if it is determined that a sub sense result and a main sense result are in coincidence with each other, then determination is made on whether or not the main sense result indicates the erased state (step S37). If the main sense result indicates the erased state, it is determined that compensation for a threshold voltage of a corresponding memory cell has been made to complete the erased state, followed by designation of the next address (step S38). Specifically, determination is made on whether the current address is the last address, or it is determined whether or not the erase verify operation on the last address is completed (step S39). If the current address is determined to be the last address, and it is determined that the next address exceeds the last address, the erasure is completed.

On the other hand, if the verify operation on all the memory cells to be erased is completed, the process returns to a process node B to perform an erase setting again (step S20). This is because in the last verify operation, a current level of reference current Iref is raised in the last verify setting step (step S27), and it is required to re-set a quantity of the reference current to an original state where a margin is severe.

On the other hand, in step S37, if a main sense result indicates a state different from the erased state, it is determined that a corresponding memory cell is non-erasable, and a defect (NG) is indicated and a necessary error processing is performed.

In an erase operation, the reference current condition is changed when a predetermined number of times of verification is performed and a verify defect occurs in the verify operation of a memory cell. Accordingly, a memory cell of a margin failure can be repaired and the deteriorated memory cell characteristic can be compensated for.

Note that in the above description, erasure is performed in a memory cell by injection of hot electrons. As an erase operation, however, a collective erase operation may be performed in a word line unit, for example.

In such a collective erase operation, memory cells in non-erased state are detected according to a verification result and an erasure pulse is applied thereto, and a memory cell in over-erased state might be present. In order to restore a memory cell in the over-erased state, there is performed re-writing after erasure (write-back) is performed, or the write-back operation of setting all the threshold voltages of memory cells to a positive voltage level in a memory cell unit. As erase verification, there is performed an operation of verifying that every bit is in the eased state but not in the over-erased state. On writing-back, a write-back pulse is applied to an over-erased memory cell with a memory cell being a unit. The writing-back is performed just by applying write-back pulses on a word line of an erasure object till no current will flow in a bit line while the word line is maintained in non-selected state. Only an erase verify operation is required, and the write-back verify is not required because the write-back is performed on over-erased memory cells in a memory cell unit (since no over-writing back arises).

Figure 16:
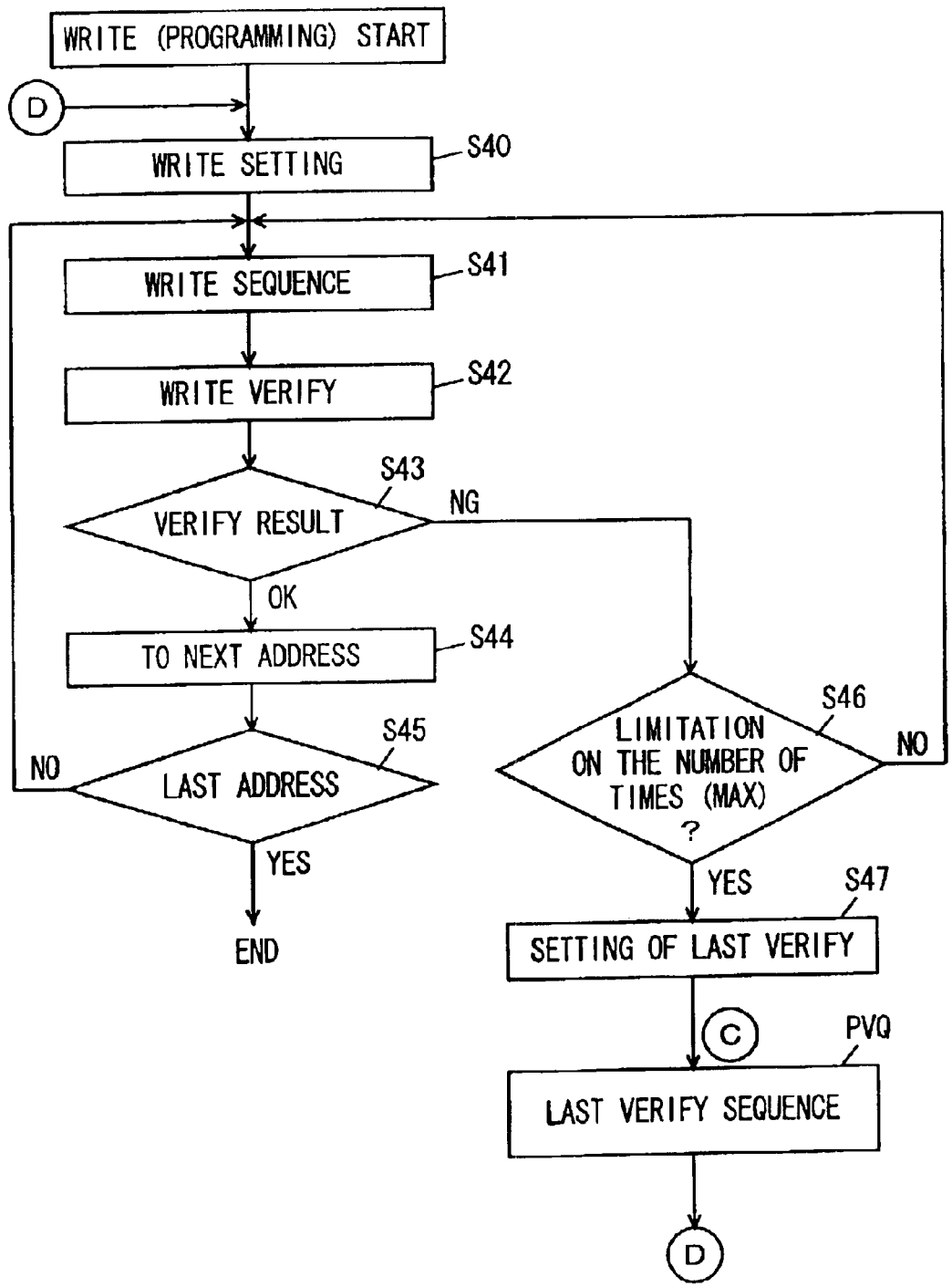
FIG. 16 is a flowchart showing an operation in write mode in the first embodiment of the present invention.

FIG. 16 is a flowchart representing an operation in write (programming) operation mode. With reference to FIG. 16, description will be given of write (programming) operation below. Here, in the following description, the term "writing" is used as being the same as "programming."

Write operation mode is designated when a write designating command is supplied. In write mode, a write program is first started in control circuit 5. Furthermore, write setting is performed for writing (step S40). The write operation is an operating mode of setting a threshold voltage of a memory cell high. In this case, in order to make a margin severe, verify current Iref to the sense amplifier is increased so as to facilitate detection of a threshold voltage drop defect. That is, in reference current generating circuit 2 shown in FIG. 12, switching transistor SW4 is set in an off state according to program mode instructing signal /PRG, to raise a voltage level of reference voltage Vref, for increasing a current level of reference current Iref. In the write setting, an operation of adjusting the reference current in accordance with comparison with an address registered in the control circuit is ceased.

When step S40 for write setting is completed, a write sequence for performing writing of data is performed on a memory cell (step S41). In the write operation, to a memory cell for which the threshold voltage is raised, a positive voltage pulse is applied to the control gate thereof, a positive voltage pulse of the order of ½ times the gate voltage is applied to the drain thereof and the source thereof is set to ground voltage level. In this state, hot electrons are generated in a drain to source current and are accelerated with the positive voltage applied to the control gate to be injected into a data storage region in the insulating film. Bit lines of memory cells other than a write target are set into floating state, to cause no channel current to flow.

Then, after the writing is completed, there is performed write verify operation to verify whether or not writing is correctly performed (step S42). In the write verify operation, comparison reference current Iref is increased in current level, in order to make the margin severe. As a result of the verification, when it is indicated that a threshold voltage of a memory cell is set sufficiently high to cause substantially no current flow in a memory cell, that is, in verification normality, the next address is set (steps S43 and S44). It is determined whether or not the next address exceeds the last address (step S45).

If the next address does not exceed the last address, there is again performed the operation in step S41 for executing the write sequence. Here, in step S45, it is determined, in setting the next address, whether or not the current address is the last address and based on the result of determination, it is further determined whether or not writing is performed on the last address. Therefore, in the write sequence shown in FIG. 16, writing is performed on a bit by bit basis.

On the other hand, in step S43, when a verify defect (NG) occurs, the number of times of verify defects is first counted in step S46 and it is determined whether or not the number of times of verify defects reaches the maximum number (MAX). If the number of times of verify defects does not reach a prescribed number, the process returns again to step S41 to perform writing to the memory cell.

On the other hand, if the number of times of verify defects reaches the prescribed number, there is performed the operation in step S47 for last verify setting. In step S47 for the last verify setting, a margin for a memory cell is set large to perform the verify operation. That is, in step S47, adjustment of reference current Iref set in step S40 is completed. That is, in FIG. 12, program instructing signal /PRG is set to H level to turn switching transistor SW4 into an on state, to lower a voltage level of reference voltage Vref to decrease a current level of reference current Iref.

When the operation in step S47 for the last verify setting is completed, there are performed the operations in steps in process node C et seq. of the last verification sequence PVQ for writing.

Figure 17:
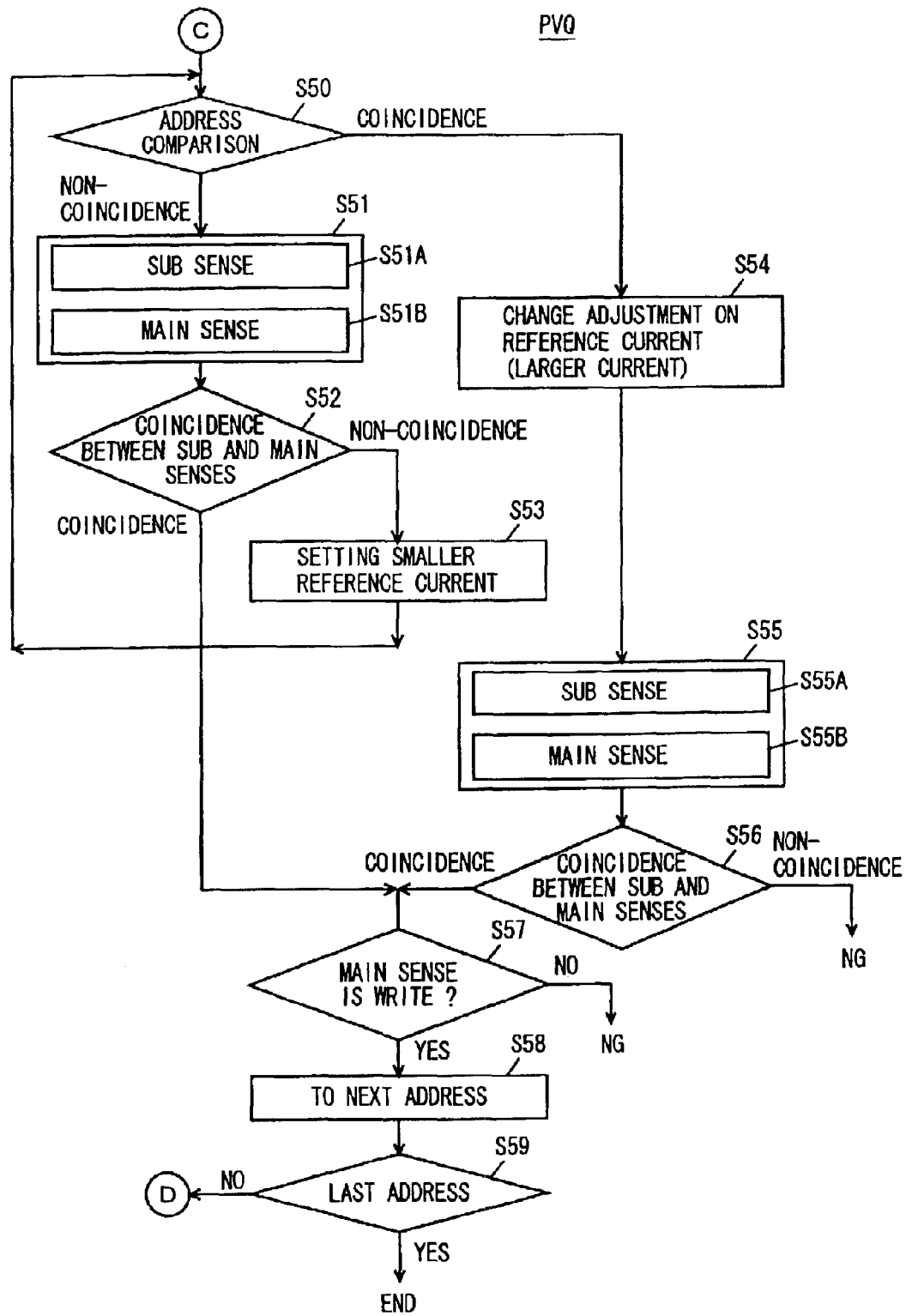
FIG. 17 is a flowchart showing contents of an operation in the last verify sequence shown in FIG. 16.

FIG. 17 is a flowchart showing contents of an operation in the write last verify sequence PVQ shown in FIG. 16. With reference to FIG. 17, description will be given of the last verify operation for writing below.

In FIG. 17, in the last verify sequence for writing PVQ, after the operation in step S47 for the last verify setting is completed, it is first determined whether the address of a memory cell of interest is registered at reference current adjusting sections 20 and 22 (step S50). If the address is registered yet, reading of data in the memory cell is performed (step S51). In step S51, there are performed the operation in step S51A for a sub sense operation and the operation in step S51B for a main sense operation, or the dual sense operation is performed.

In the write verification, a write verify voltage is higher than an erase verify voltage. In step S51, a current level of reference current Iref flowing into the sense amplifier is set to be larger than reference current Iref in step S42 for write verification shown in FIG. 16, and a margin is increased.

Then, it is determined whether or not a sub sense result and a main sense result are in coincidence/non-coincidence with each other (step S52). If the sub sense result and the main sense result are in non-coincidence with each other, a current (a residual current) Irmn flowing into the sense amplifier is decreased since the memory cell is in a margin failure state while set in the written state and a comparatively large current flows in the memory cell. Therefore, in order to decrease comparison reference current Iref for the memory cell, the address thereof is registered at reference current adjusting section 22 shown in FIG. 12 (step S53). Then, after the operation in step S53 is completed, the process returns again to step S50.

In step S50 for address comparison, since the address of the memory cell is already registered at reference current adjusting section 22 in step S53, the address comparison result indicates coincidence, adjustment of the comparison reference current is performed to decrease a level of the comparison reference current (step S54).

Then, with the comparison reference current decreased, write verify reading of data from the memory cell is again performed (step S55). In step S55 as well, there performed two sensing operations of a sub sense operation in step S55A and a main sense operation in step S55B.

Then, it is determined whether or not the sub sense result and the main sense result are in coincidence/non-coincidence with each other (step S56). In step S55, the comparison reference current is adjusted to have a current level decreased and the residual current is set to a decreased state, that is, to a state corresponding to a threshold voltage lowering defect. In this state, if the sub sense result and the main sense result are in non-coincidence with each other, such a state is determined a verify defect (NG) in which margin failure cannot be resolved, and a necessary error processing is performed.

On the other hand, if the sub sense result and the main sense result, in steps S55 and S56, are in coincidence with each other, then it is determined whether or not the main sense result indicates the written state (step S57). In step S57, if the main sense result does not indicate the written state, it is a verify defect and the memory cell is determined to be a write defect (NG), followed by a necessary error processing.

If the main sense result indicates the written state, a margin failure of the memory cell is resolved, and the next address is designated (step S58). Then, it is determined whether or not the operation for the last address is completed (step S59). If an operation for the last address is not completed yet, the process transitions to a process node D and the operation in step S40 for the write setting shown in FIG. 16 is again performed. That is, again at the next address, the reference current is increased to reduce a margin and a verify operation is performed regardless of registration/non-registration of the address.

Therefore, in verify operations on memory cells, a quantity of the comparison reference current is adjusted for only a memory cell causing a verify defect a prescribed number of times. Thus, a correct sense operation can be performed while resolving a margin failure of only a memory cell with a margin failure, without causing a margin failure in a normal memory cell.

In a case where an address is registered at reference current adjusting section 20 and 22, if deterioration in memory cell characteristic has occurred, the memory cell characteristic gets worsened in the same direction with increase in the number of times of rewriting. Therefore, especially no necessity arises for cancellation of the address after registration. In a case where a memory cell causing the threshold voltage lowering defect in the written state is set into an erased state, the memory cell causing the threshold voltage lowering defect and set in the erased state, can sufficiently increase the margin for reference current Iref, and data can be correctly read out therefrom. Therefore, especially no necessity arises for cancellation of a registered address according to a logical level of stored data in a memory cell.

As described above, according to the first embodiment of the present invention, in reading of memory cell data (including verify operation), sense operations for margin detection and for data reading are performed under the states of different margins. In addition, a memory cell with a margin failure is detected, and a sense current (reference current) is adjusted according to a result of the detection so as to compensate for the margin failure. Margin compensation can be performed correctly only for a memory cell with a margin failure. Thus, reading of data in a memory cell with a threshold voltage defect can be correctly performed without exerting an adverse influence on reading of data in a normal memory cell, thereby enabling repairing of a memory cell with a margin failure to extend a product life time.

In compensation of a margin failure, adjustment is made in only a quantity of the reference current supplied to the sense amplifier, thereby enabling compensation of a sense margin failure with ease.

A margin failure is detected by sense operations with different sense margins from each other according to a dual sense scheme, thereby enabling detection of a memory cell with a sense margin failure with certainty.

In the above construction, a residual current of a current flowing into a memory cell from a read current supply circuit supplying a current to the memory cell and a reference current are sensed by a sense amplifier. A configuration may be employed in which, to the sense amplifier, a current flowing through a memory cell and a bit line (virtual source line) is supplied and the reference current is also adjusted according to a quantity of a current flowing from the memory cell through the virtual source line.

Second Embodiment

Figure 18:
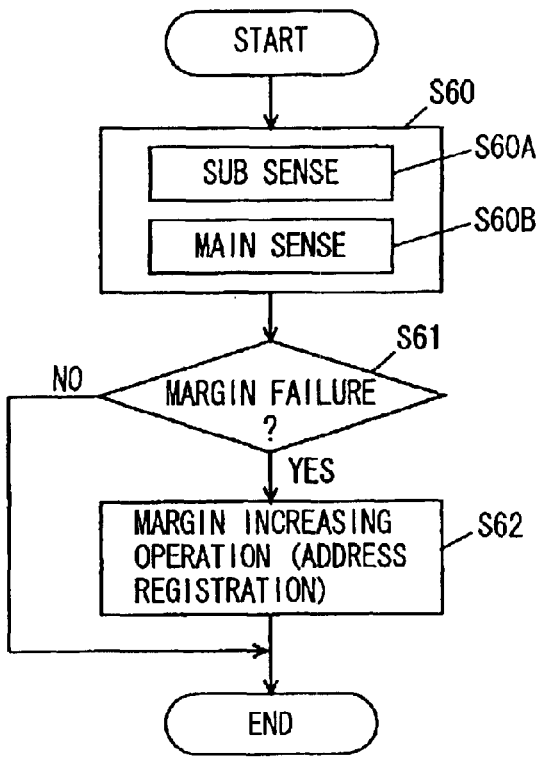
FIG. 18 is a flowchart showing a margin failure detecting operation in a second embodiment of the present invention.

FIG. 18 is a flowchart showing a margin compensation of a non-volatile semiconductor memory device according to a second embodiment of the present invention. In FIG. 18, in compensating for a margin failure, data in a memory cell is first read out (including verify operation). In step S60, dual sensing is performed; a sub sense operation in step S60A and a main sense operation in step S60B are performed. The sub sense operation in step S60A and the main sense operation in step S60B are the same as those in the dual sense operation in the first embodiment.

Then, it is determined whether or not a margin failure occurs according to a sub sense result and a main sense result (step S61). In step S61, if no margin failure is generated and data is correctly read, or if the main sense result and the sub sense result are at the same logical level, no margin adjustment is performed.

In step S61, however, if the main sense result and the sub sense result are in coincidence with each other, but the main sense result is different from rewrite data in logical level, necessary error processing is performed, based on the determination that a rewrite defect occurs and a margin failure is not resolved yet.

On the other hand, in step S61, when it is determined that a margin failure exists, that is, when the sub sense result and the main sense result are different from each other, a processing for increasing a margin is performed (step S62). In step S62 for increasing the margin, it is determined which direction to increase a margin, that is, whether a threshold voltage lowering defect or a threshold voltage rising defect occurs. Based on the result of determination, the direction of threshold voltage defect is registered together with an address indicating the threshold voltage defect. In this case, a threshold voltage defect address may be registered in a program circuit, together with a flag indicating a kind of the threshold voltage defect.

In step S62 for increasing the margin, an operation for suppressing an occurrence of a margin failure in a sub sense operation is performed in the processing of increasing the margin. That is, adjustment of a voltage level of a read voltage (including a verify voltage), adjustment of a memory cell drain voltage (a bit line voltage), or other is performed according to the registered address and a corresponding threshold voltage defect indicating flag. Therefore, an operation of resolving a margin failure is not limited to an operation for adjusting the reference current for the sense amplifiers. When a change in threshold voltage is generated due to a change in characteristic of threshold voltage, what is required at least is to perform an operation of compensating for the change in threshold voltage to equivalently achieve a state where the threshold voltage changes.

Figure 19:
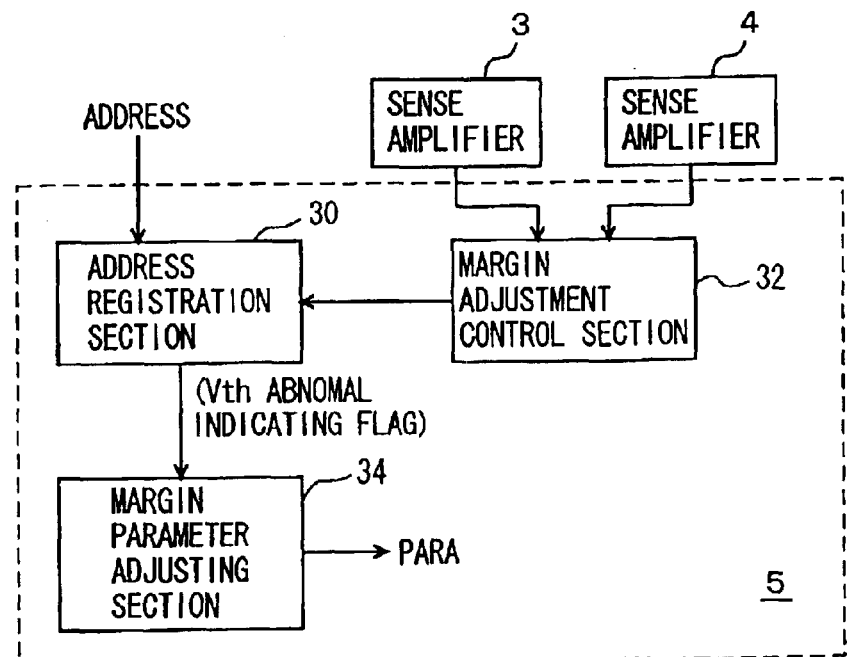
FIG. 19 is a diagram schematically showing a margin failure adjusting section of a control circuit of the second embodiment of the present invention.
Figure 20:
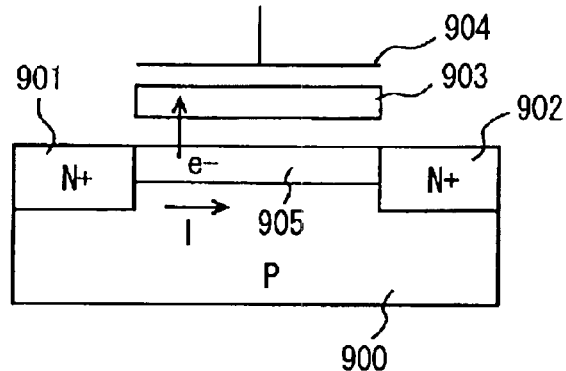
FIG. 20 is a diagram schematically showing a sectional structure of a memory cell of a conventional non-volatile semiconductor memory device.
Figure 21:
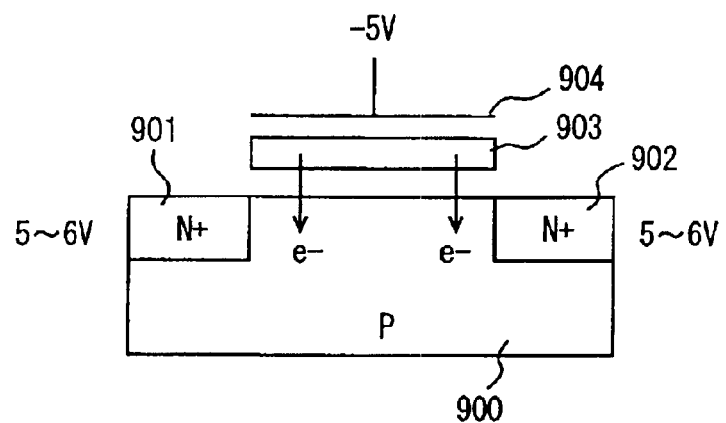
FIG. 21 is a diagram showing an example of applied voltages in erase operation in a conventional non-volatile memory cell.
Figure 22:
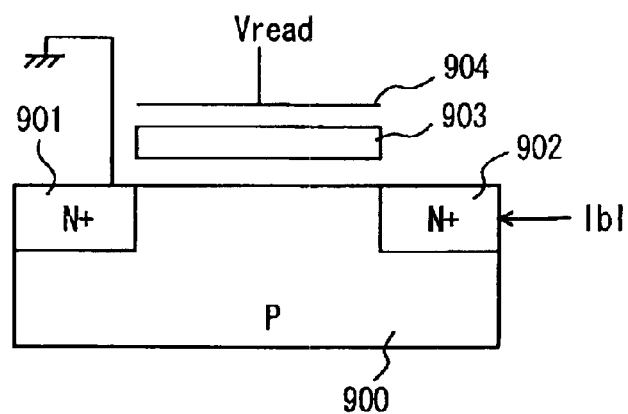
FIG. 22 is a diagram illustrating applied voltages to a conventional non-volatile memory cell in a data reading.

FIG. 19 is a diagram schematically showing a configuration of a main part of a control circuit according to the second embodiment of the present invention. In FIG. 19, control circuit 5 includes: an address registration section 30 registering the address of a memory cell with a threshold voltage defect; an address margin adjustment control section 32 for determining whether or not a margin failure arises according to output signals of sense amplifiers 3 and 4 and registering the address at the address registration section 30 together with a flag indicating a threshold voltage (Vth) abnormality according to a result of the determination; and a margin parameter adjusting section 34 for adjusting margin determining parameters PARA according to a registration address designation instructing signal from address registration section 30.

Parameter PARA adjusted by margin parameter adjusting section 34 includes a read voltage, a bit line voltage and other(s). As for margin adjusting parameter PARA, a voltage level serving as a comparison reference may be adjusted if the sense amplifier is of a voltage sense scheme. In a case where there is allowance in time for data reading, there may be performed an operation such as delaying the timing of start of a sense operation. Parameter PARA is adjusted so as to compensate for a threshold voltage abnormality to cause a margin failure.

A threshold voltage abnormality flag indicates the direction of a change in threshold voltage caused by a change in threshold voltage characteristic. Instead, similarly to the first embodiment, address registration section 30 may be configured to have an address registration section storing the address of a memory cell with a rise in threshold voltage and an address registration section storing the address of a memory cell with a drop in threshold voltage provided separately.

As described above, according to the second embodiment of the present invention, when a margin failure arises in a sense amplifier in data reading, the address of a memory cell causing a margin failure is registered, and a parameter to determine a sense margin is adjusted in the direction of compensating for reduced sense margin according to a registered address and information indicating a threshold voltage abnormality. Thus, data in a memory cell with a margin failure can be read correctly while compensating for a margin failure without exerting an adverse influence on reading of data in normal memory cells.

Other Example Applications

Application of the configuration in which a plurality of sense amplifiers are coupled in parallel to an internal bus to operate these sense amplifiers with different sense margins from each other to detect a sense margin failure is not limited to this non-volatile semiconductor memory device. Generally, this multi-sense scheme can be applied to any semiconductor memory device, provided that data read out internally from a memory cell is sensed by a sense amplifier to generate internal read data. Error detection on internal data can be achieved by detecting non-coincidence between logical levels of output data of sense amplifiers. In addition, correct reading of data can be secured by determining a logical level of output signals from plural sense amplifiers of 3 or more in compliance with a majority principle.

A configuration in which in data reading, set conditions for reading of data in a memory cell are changed according to the address of the memory cell can be applied to a general semiconductor memory device as well. That is, for example, in a case where a read voltage of a memory cell is low, when the memory cell of a low read voltage is selected, conditions set for reading from a memory cell are changed by adjusting an appropriate parameter among various parameters in the second embodiment. Thus, the read voltage from the memory cell can be equivalently increased to read memory cell data correctly.

While each embodiment is described with reference to an insulating film trapping type non-volatile semiconductor memory device storing data by accumulating electrons in an insulating film. As a non-volatile semiconductor memory device, however, a non-volatile semiconductor memory device storing data by accumulating electric charges in a floating gate formed of an electrically conductive material such as polysilicon may be employed.

Furthermore, contrary to the first embodiment, written state and erased state of a memory cell may be correlated to a low threshold state and a high threshold state, respectively.

As described above, according to the present invention, detection is made on a sense margin failure due to a change in a threshold voltage characteristic of a memory cell and a parameter to determine a sense margin is changed so as to compensate for the margin failure. Accordingly, data in a memory cell with a margin failure can be read correctly without exerting an adverse influence on data reading from a normal memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
    a plurality of non-volatile memory cells each for storing data in a non-volatile manner and each including a memory cell transistor having a threshold voltage changed in accordance with storage data;
    detection circuitry for detecting and storing a change in threshold voltage characteristic for each of the plurality of non-volatile memory cells;
    read circuitry for reading stored data in a selected memory cell of said plurality of non-volatile memory cells, in accordance with comparison of a read current corresponding to a current flowing in said selected memory cell with a reference current; and
    reference current control circuitry for setting a magnitude of said reference current in accordance with a result of detection by said detection circuitry.

2. The non-volatile semiconductor memory device according to claim 1, wherein
    said reference current control circuitry is configured to change a magnitude of said reference current, in accordance with a result of detection by said detection circuitry, such that an influence on said read current exerted by a change in threshold voltage characteristic of said selected memory cell is cancelled.

3. The non-volatile semiconductor memory device according to claim 1, wherein
    each memory cell transistor has a threshold voltage changed in accordance with its change in threshold voltage characteristic, and
    said reference current control circuitry is configured to, according to the result of detection by said detection circuitry, increase a magnitude of said reference current when said read current increases in accordance with the change in threshold voltage characteristic of said selected memory cell.

4. The non-volatile semiconductor memory device according to claim 1, wherein
    each memory cell transistor has a threshold voltage changed in accordance with its change in threshold voltage characteristic, and
    said reference current control circuitry is configured to, according to the result of detection by the detection circuitry, decrease a magnitude of said reference current when said read current decreases in accordance with the change in threshold voltage characteristic of said selected memory cell.

5. The non-volatile semiconductor memory device according to claim 1, wherein
    said detection circuitry includes:
    an address storage circuit for storing an address of a memory cell of which threshold voltage characteristic changes; and
    a comparison circuit for comparing an applied address designating said selected memory cell with a stored address in said address storage circuit and outputting a signal indicating a result of comparison, and
    said reference current control circuitry is configured to set a magnitude of said reference circuit in accordance with said result of comparison.

6. The non-volatile semiconductor memory device according to claim 5, wherein
    said address storage circuit further stores, associated with the address indicating a location of said memory cell, information indicating a direction of a change in threshold voltage of said memory cell due to the change in threshold voltage characteristic.

7. The non-volatile semiconductor memory, device according to claim 5, wherein
said address storage circuit includes:
a first address storage circuit for storing an address of a memory cell having a threshold voltage increased in accordance with the change in threshold voltage characteristic; and
a second address storage circuit, for storing an address of a memory cell having a threshold voltage decreased in accordance with the change in threshold voltage characteristic.

8. A semiconductor memory device comprising:
a plurality of memory cells arranged in rows and columns;
a plurality of bit lines, provided corresponding to the memory cell columns, each connecting to the memory cells on a corresponding column connected;
a plurality of sense amplifiers, electrically coupled commonly to a bit line connecting to an addressed memory cell of said plurality of memory cells, each for amplifying data of said addressed memory cell appearing on said bit line when activated; and
sense control circuitry for controlling operations of said plurality of sense amplifiers in different ways from each other.

9. The semiconductor memory device according to claim 8, wherein
each of said plurality of sense amplifiers is configured to compare a read current corresponding to a current flowing through the bit line connecting to the addressed memory cell with reference data on a reference data line and outputs a signal indicating a result of comparison.

10. The semiconductor memory device according to claim 9, wherein
said reference data line is configured to transmit a reference current as said reference data, and
each sense amplifier is configured to compare a read current corresponding to the current flowing through the bit line connecting to the addressed memory cell with the reference current, and outputs a signal indicating a result of comparison.

11. The semiconductor memory device according to claim 8, wherein
said sense control circuitry is configured to activate said plurality of sense amplifiers such that each of said plurality of sense amplifiers has a sensing margin, different from those of the other sense amplifiers, for the data of the addressed memory cell.

12. The semiconductor memory device according to claim 8, further comprising
detection circuitry for detecting a sense margin failure for stored data of said addressed memory cell in accordance with output signals of said plurality of sense amplifiers.

13. The semiconductor memory device according to claim 8, further comprising
internal read circuitry for generating internal read data corresponding to stored data of said addressed memory cell in accordance with an output signal of a prescribed sense amplifier of said plurality of sense amplifiers.

14. A semiconductor memory device comprising:
a plurality of memory cells;
reference circuitry for generating and outputting reference data having a condition thereof changeable;
internal read circuitry for comparing data read from a selected memory cell of said plurality of memory cells with said reference data and reading the data in said selected memory cell on the basis of a result of comparison; and
reference data control circuitry for selectively changing, in a specific operation mode, the condition for the reference data outputted by said reference circuitry in accordance with an address of said selected memory cell.

15. The semiconductor memory device according to claim 14, further comprising:
an address storage circuit for storing an address of a memory cell which is determined that its threshold voltage characteristic changes; and
a determination circuit for determining whether an address of said selected memory cell is stored in said address storage circuit; wherein
said reference data control circuitry is configured to change the condition for the reference data in accordance with a result of determination of the determination circuit.

16. The semiconductor memory device according to claim 14, wherein
each of said plurality of memory cells includes a memory transistor having an charge accumulating region accumulating a charge and having a threshold voltage changed in accordance with the charge accumulated in said charge accumulating region, and
said reference data control circuitry is configured to change the condition for said reference data in a verify operation mode for detecting whether charges corresponding to stored data are accumulated in said charge accumulating region of said selected memory cell.

17. The semiconductor memory device according to claim 16, wherein
said verify operation mode is an operating mode of detecting whether said selected memory cell is set to a first state where a charge is extracted from said charge accumulating region,
said reference data is a current flow, and
said reference data control circuitry is configured to change a magnitude of the current flow as said reference data on the basis of a threshold voltage of said selected memory cell in said first state.

18. The semiconductor memory device according to claim 16, wherein
said verify operation mode is an operating mode of detecting whether said selected memory cell is set to a first state where a charge is injected into said charge accumulating region,
said reference data is a current flow, and
said reference data control circuitry is configured to change a magnitude of the current flow as said reference data on the basis of a threshold voltage of said selected memory cell in said first state.

19. The semiconductor memory device according to claim 14, further comprising:
an address storage circuit for storing an address; and
a determination circuit for determining whether an address stored in said address storage circuit is designated in a read mode for reading the data in said selected memory cell, wherein said reference data control circuitry is configured to change the condition for said reference data when said determination circuit determines that said address stored in said address storage circuit is designated in a read mode for reading the data in said selected memory cell.

20. The semiconductor memory device according to claim 19, wherein said internal read circuitry includes a circuit for comparing a current corresponding to the data in said selected memory cell with a reference current corresponding to said reference data, and said reference data control circuitry is configured to change a magnitude of said reference current.

* * * * *